(12) United States Patent
Peddle

(10) Patent No.: US 9,495,245 B2
(45) Date of Patent: Nov. 15, 2016

(54) HIGH SPEED FLASH CONTROLLERS

(71) Applicant: Charles I. Peddle, Santa Cruz, CA (US)

(72) Inventor: Charles I. Peddle, Santa Cruz, CA (US)

( * ) Notice: Subject to any disclaimer, the term of this patent is extended or adjusted under 35 U.S.C. 154(b) by 0 days.

(21) Appl. No.: 14/831,575

(22) Filed: Aug. 20, 2015

(65) Prior Publication Data

US 2015/0355965 A1 Dec. 10, 2015

Related U.S. Application Data

(63) Continuation of application No. PCT/US2014/020406, filed on Mar. 4, 2014.

(60) Provisional application No. 61/774,175, filed on Mar. 7, 2013.

(51) Int. Cl.
| | | |
|---|---|---|
| *G11C 29/00* | (2006.01) | |
| *G06F 11/10* | (2006.01) | |
| *G06F 13/40* | (2006.01) | |
| *G11C 29/52* | (2006.01) | |
| *G06F 13/28* | (2006.01) | |
| *G06F 13/16* | (2006.01) | |

(52) U.S. Cl.
CPC ....... *G06F 11/1072* (2013.01); *G06F 11/1048* (2013.01); *G06F 13/1673* (2013.01); *G06F 13/28* (2013.01); *G06F 13/4022* (2013.01); *G11C 29/52* (2013.01); *G06F 2213/3812* (2013.01); *G06F 2213/3854* (2013.01)

(58) Field of Classification Search
CPC ........................ G06F 11/1048; G06F 13/1873; G06F 13/28; G06F 2213/3812
See application file for complete search history.

(56) References Cited

U.S. PATENT DOCUMENTS

| | | | | |
|---|---|---|---|---|
| 6,792,501 B2 * | 9/2004 | Chen | ..................... | G06F 3/0616 711/103 |
| 7,103,684 B2 * | 9/2006 | Chen | ...................... | G06F 13/28 710/20 |
| 7,187,613 B2 * | 3/2007 | Yang | ...................... | G11C 29/82 365/185.03 |
| 7,660,938 B1 * | 2/2010 | Chow | ................. | G06F 13/4045 710/313 |
| 7,752,029 B2 * | 7/2010 | Tamayo | ................ | G06F 11/261 703/20 |
| 8,037,232 B2 * | 10/2011 | Chu | ..................... | G06F 11/1072 711/103 |
| 8,364,911 B2 | 1/2013 | Shpeisman et al. | | |
| 8,799,593 B2 * | 8/2014 | Chung | ................ | G06F 12/0246 711/157 |
| 2003/0007478 A1 | 1/2003 | Jiang | | |
| 2006/0224789 A1 | 10/2006 | Cho et al. | | |
| 2008/0162753 A1 | 7/2008 | Liu et al. | | |
| 2008/0177956 A1 | 7/2008 | Peddle | | |
| 2009/0172257 A1 * | 7/2009 | Prins | ................... | G06F 13/1657 711/103 |
| 2009/0172259 A1 | 7/2009 | Prins et al. | | |
| 2009/0219270 A1 | 9/2009 | Penev et al. | | |
| 2011/0066837 A1 | 3/2011 | Lee et al. | | |
| 2011/0066920 A1 * | 3/2011 | Yu | ...................... | G06F 11/1064 714/758 |

FOREIGN PATENT DOCUMENTS

EP 2330596 A1 6/2011

* cited by examiner

*Primary Examiner* — Esaw Abraham
(74) *Attorney, Agent, or Firm* — Steven L. Nichols; Fabian VanCott

(57) ABSTRACT

A high speed USB memory controller includes a microprocessor, flash memory, memory buffers directly accessible to the microprocessor and flash memory, and a USB interface for writing data directly into the memory buffers. This allows devices with multiple flash die to operate at full bus speed.

30 Claims, 25 Drawing Sheets

Index Table

| Die Logical record # | Group # (pages per block) | blocks |
|---|---|---|
| 0 | 256 | 4228 |
| 17317888 | 254 | 3345 |
| 30911968 | 252 | 508 |
| 32960224 | 250 | 96 |
| 33344224 | 248 | 27 |
| 33451360 | 240 | 10 |
| 33489760 | 220 | 10 |
| 33524960 | 136 | 10 |
| 33546720 | 60 | 10 |
| 33556320 | 9 | 10 |

*Fig. 3*

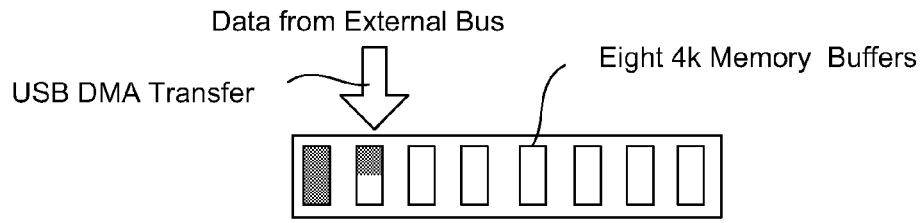
*Fig. 9A*
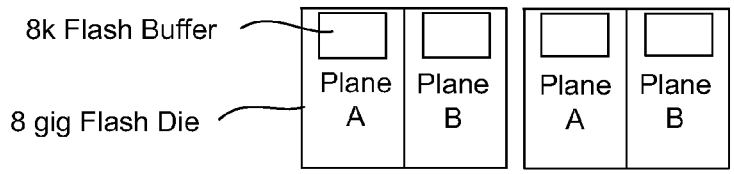
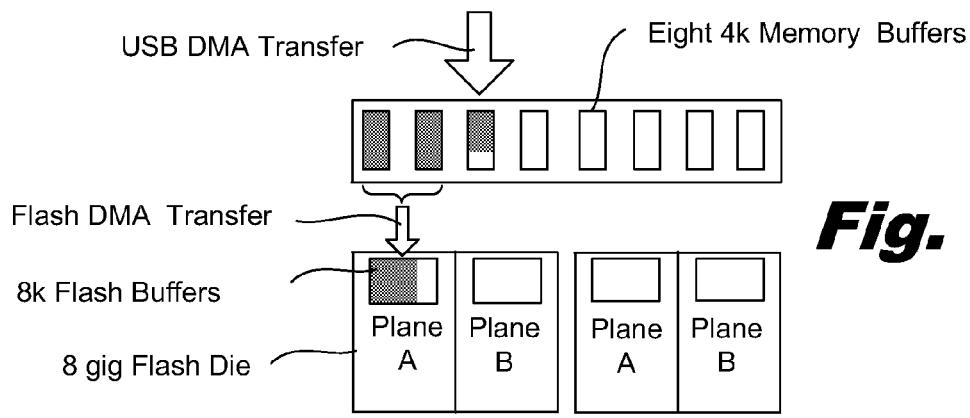
*Fig. 9B*
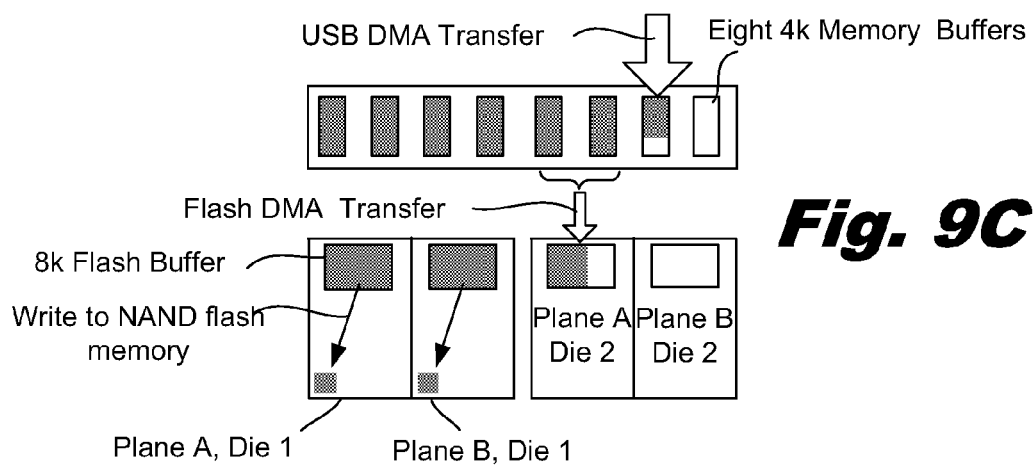
*Fig. 9C*

Translation Table

| Die 1 Even Block # | Die 1 Odd Block # | Die 2 Even Block # | Die 2 Odd Block # | Die 3 Even Block # | Die 3 Odd Block # | Die 4 Even Block # | Die 4 Odd Block # |

| Die 1 Next Even Block # | Die 1 Next Odd Block # | Die 2 Next Even Block # | Die 2 Next Odd Block # | Die 3 Next Even Block # | Die 3 Next Odd Block # | Die 4 Next Even Block # | Die 4 Next Odd Block # |

⎫ For a single die device just these entries continue ⎭

⎫ For a two die device these four entries continue ⎭

⎫ For a four die device all eight entries continue ⎭

*Fig. 18*

HIGH SPEED FLASH CONTROLLERS

BACKGROUND

Flash memory is nonvolatile computer storage that can be electrically erased and reprogrammed. In general, flash memory has a high resistance to mechanical shock, small foot print, relatively fast read times that are comparable to dynamic Random Access Memory (RAM), is energy efficient and can store data for years without power. Flash memory is used in a variety of applications, including personal computers, mobile devices, digital cameras, video games, scientific instrumentation, industrial robots, medical electronics and other devices.

Flash memory has several limitations, including slow write times and limited lifetime. For flash memory, the write times are typically an order of magnitude greater than the read times. The lifetime of various types of flash memory typically ranges from 1000 to 100,000 erase cycles. The erasure of the flash memory causes incremental damage that eventually leads to failure of the memory mechanism in the flash memory.

Flash memory is used in conjunction with a wide variety of technologies, including Universal Serial Bus (USB) devices. For example, a solid state memory device can be created with a bank of flash memory that accessed using a USB controller and USB protocols. The USB specification is an industry standard developed that defines cables, connections, and communication protocols used to communicate and supply power between computers and electronic devices. The USB standard continues to evolve to faster data transfer speeds and greater power transfer capability. USB 2.0 has a maximum bandwidth of 480 Megabits/second (60 Megabytes/second) and power transfers of 1.5 amperes. USB 3.0 has 5 Gigabits/second (625 Megabytes/second) and power transfers of 1.5 amperes, with a maximum current of 5 amperes. There are billions of USB interfaces and USB enabled devices in the global market place with about 2 billion additional USB enabled devices being sold each year. One application for USB technology is in data storage devices. USB data storage devices typically include flash memory with an integrated USB interface, are relatively small, and removable/rewritable. While USB devices support USB connectivity, even the fastest USB drives do not currently support the full transfer rate of the USB specification and fall considerably short of the transfer rate possible from a current generation hard disk.

BRIEF DESCRIPTION OF THE DRAWINGS

The accompanying drawings illustrate various examples of the principles described herein and are a part of the specification. The illustrated examples are merely examples and do not limit the scope of the claims.

FIG. 3 is an example of a index table, according to one example of principles described herein.

FIGS. 9A-9F describe illustrative methods for streamlined writing to and reading from flash memory, according to one example of principles described herein.

FIG. 18 is a diagram of a translation table, according to one example of principles described herein.

Throughout the drawings, identical reference numbers designate similar, but not necessarily identical, elements.

DETAILED DESCRIPTION

Figure 1:
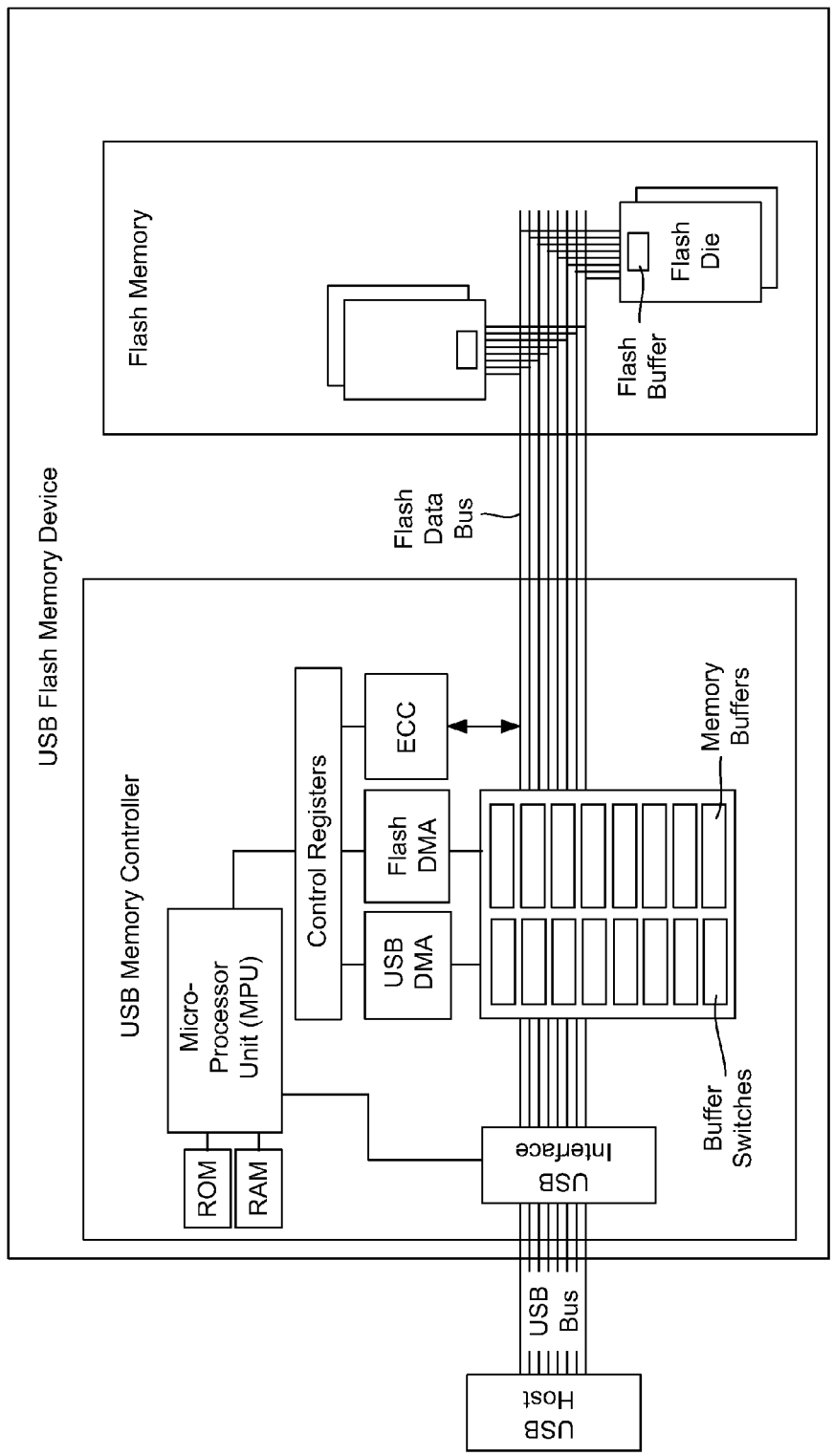
FIG. 1 is a block diagram of an illustrative USB flash memory device, according to one example of principles described herein.

Flash memory is used as a compact, energy efficient and robust way to store data in a wide variety of applications. However, the relatively slow write times and limited read/write lifetime of flash memory are significant challenges. Flash memory is used in conjunction with a wide variety of technologies, including Universal Serial Bus (USB) devices. For example, a solid state memory device can be created with a bank of flash memory that is accessed using a USB controller and USB protocols. Because of the relatively slow write times of the flash memory and other bottlenecks, data transfer rates in flash memory devices can be significantly slower than the capabilities of the buses connected to the flash memory devices.

The principles below describe illustrative flash controllers, systems and methods for increasing the speed and robustness of flash memory devices. For purposes of illustration, these principles are discussed in the context of USB memory devices. However, these principles are applicable to a wide variety of devices and protocols that incorporate flash memory.

USB specification is an industry standard that defines cables, connections, and communication protocols used to communicate and supply power between computers and electronic devices. The USB standard continues to evolve to faster data transfer speeds and greater power transfer capability. USB 2.0 specification defines a maximum bandwidth of 480 Megabits/second (60 Megabytes/second) and power transfers of 1.5 amperes. USB 3.0 has 5 Gigabits/second (625 Megabytes/second) and power transfers of 1.5 amperes, with a maximum current of 5 amperes. There are billions of USB interfaces and USB enabled devices in the global marketplace with about 2 billion additional USB enabled device being sold each year.

USB memory devices have a number of advantages including solid-state operation, high shock resistance and variable form factors. Additionally, USB memory devices typically consume far less power during operation than hard disk drives. However, even the fastest USB drives do not support the full transfer rate of the USB specification and fall considerably short of the transfer rate possible from a current generation hard disk. The specification below describes principles that can be applied to create high-speed USB architectures, USB controllers, methods, and systems that significantly increase the data transfer rates for USB flash memory devices.

In the following description, for purposes of explanation, numerous specific details are set forth in order to provide a thorough understanding of the present systems and methods. It will be apparent, however, to one skilled in the art that the present apparatus, systems and methods may be practiced without these specific details. The principles described herein allow appropriate hardware and software to be implemented and adapted to specific circumstances and designs. Reference in the specification to "an example" or similar language means that a particular feature, structure, or characteristic described in connection with the example is included in at least that one example, but not necessarily in other examples.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

A significant portion of the cost of a flash memory device is the cost of the nonvolatile memory die that are used to store the data. The memory die are typically flash memory—although other types of memory have been proposed—including Ferroelectric Random Access Memory (FeRAM), Magnetoresistive Random Access Memory (MRAM), Programmable Metallization Cell (PMC), Phase-Change Memory (PCM), and other technologies. Each of these types of nonvolatile memory types has advantages and disadvantages. However, flash memory is the most mature technology and has the lowest cost per unit of storage capacity. There are two predominant types of flash memory: NOR type and NAND type. Both NOR and NAND flash store data in memory cells made from floating gate transistors. These floating gate transistors have a finite number of program-erase cycles before wear begins to deteriorate the integrity of the storage. For example, NOR flash memory may have a typical endurance rating of 100,000 cycles and NAND flash memory may have a typical endurance rating between 1,000 to 3,000 cycles.

NOR type flash memory allows for a single byte to be written and/or read independently. However, this random access feature makes NOR memory less dense per unit area and more expensive per unit of storage. NAND type flash is very high density and has a correspondingly lower cost per unit of storage. For purposes of explanation, NAND type flash will be used in illustrative examples of flash memory devices. However, the principles described herein can be applied to a wide variety of nonvolatile memory types.

The physical NAND flash memory is divided into sectors, pages, blocks and planes. These sectors, pages, blocks and planes may have a variety of configurations and sizes. For purposes of description, flash memory with the following specifications is used as an example. A sector is 512 bytes of data with additional room for header and Error Correction Code (ECC) information. A page is a group of sectors, a block is group of pages, and a plane is a collection of blocks. In one example, a page includes 4 kilobytes or 8 kilobytes for data and additional room for header information. When the page size is greater than buffer size, there is additional logic that allows two buffers to be used to store and transfer data to one flash page. This is done by considering the register number 0 and 4 that are controlled by having the second register which has the 1 in the appropriate position of the selection register. The registers are assigned in twos. A block may be a group of 128 or 256 pages for MLC and for TLC a block may be a group of 516 or more and a plane may be a group of 2048 or more blocks. For purposes of illustration, the examples below describe MLC, however the principles are equally applicable to TLC.

In the examples below, each flash die contains two planes and may have a capacity of 8 to 16 gigabytes. A memory device may include any number of flash dies. Assuming an 8 gigabyte die, a 32 gigabyte device may include 8 planes or 16,384 blocks. A 256 gigabyte device may include 64 planes or 131,072 blocks.

The examples that are given below are directed to a typical 32 GB flash device and are used to illustrate principles described herein. The principles described can apply to any type of flash currently on the market or under development. It is expected that capacities of flash will increase over time. For example, the page size in flash may increase to 8 or 16 kilobytes from the 4 kilobyte description given above. The memory controller starts up by reading a fixed field in the die that describes the characteristics of the flash, pages, block size, and adjusts the controller programming to the specific characteristics of the flash, including the various sizes of pages and blocks. Consequently, the controller can automatically adapt to the characteristics of any flash die, now or in the future.

The typical process for accepting data in a flash controller is slow and inefficient. For example in a USB device, the USB interface has to accept data at the rate it is received from the USB bus. The typical design includes a USB interface with a dedicated sector sized memory buffer (typically 512 bytes). The data on the USB bus is transferred in sectors. As the USB interface receives a sector, it loads it into the dedicated first-in-first-out (FIFO) memory buffer. This dedicated memory buffer is not accessible by other devices and the data is not usable until it is transferred to a separate memory. The USB controller then sequentially accesses the sectors stored in the FIFO memory buffer. The FIFO memory buffer restricts data flow because it can only be accessed serially (i.e. the first data in must be the first data out). This prevents parallel access data that is stored in the FIFO memory buffer.

The present system eliminates the dedicated memory buffer, the FIFO restrictions and their associated inefficiencies. Instead, the data received by the USB interface is placed directly in memory buffers. These memory buffers are configured as registers, can be accessed in parallel and are immediately available for writing into the flash after receiving data. This eliminates the substantial delay in accepting data by the USB memory controller and allows the data to be accessed, processed, and transferred more efficiently.

FIG. 1 is a diagram of one embodiment of a USB flash memory device. The description of FIG. 1 introduces the various components within this particular USB flash memory device. The subsequent figures provide additional description related to the principles used to make and operate the USB flash memory device.

The USB flash memory device is connected to a USB host via a USB bus. The USB flash memory device includes a USB memory controller and a flash memory that includes a number of NAND flash die. The memory controller includes a microprocessor unit (MPU), a small amount of Random Access Memory (RAM), a small amount of Read Only Memory (ROM), and a number of memory buffers. For example, the memory controller may be based on a 6502 processor, with 20 kilobytes of processor addressable RAM, 40 kilobytes of ROM to store operating code, and eight memory buffers. The memory controller accepts data from an external bus (via the USB interface), accumulates the data in the memory buffers, and writes the data to the NAND flash die in the flash memory. The external bus may be a USB bus or a high-speed internal bus (where the flash controller is part of a larger device).

The USB memory controller also includes a USB Direct Memory Access (DMA) and a flash DMA. In general, a DMA protocol includes an address counter that automatically and progressively increments the memory addresses during data transfers. The DMA protocol also includes a counter that keeps track of the number of bytes transferred. To begin a DMA transfer, two commands are given: the memory location to start at and a count that tells the DMA how many bytes to transfer. The DMA independently transfers the data starting at the designated memory location until the count is exhausted. The purpose of the DMA protocol is to allow full speed transfers to and from a memory without the need for external inputs other than the memory clock and enable settings stored in the control registers. This entirely eliminates the requirement for the microprocessor unit to directly be involved with data transfers. This enables higher transfer speeds because the data transfer is not limited by the microprocessor speed or interrupted when the MPU is redirected to a different task.

The USB DMA uses control counters in the USB interface to convert serial data from the USB bus into bytes stored sequentially in what it considers its controller memory but is actually a selected section (memory buffer) of the register memory. The controller signals that it has transferred next sector and the microprocessor moves the pointer to the sector in the register. This same logic is used to change the sections (memory buffers) when they reach their capacity. Buffer switches are used to individually connect the memory buffers between various data sources, destinations, and buses. This allows data to be written to and read from the memory buffers in a very flexible and efficient manner.

In this application there are two independent DMAs with different functionality. The USB DMA controls the transfer of data from the high speed bus to a bank of memory buffers and the flash DMA transfers data to and from the flash memory from the same memory buffers. In one embodiment, data transfer from the high-speed bus to the memory buffers is the highest priority process and is interrupt driven. Data movement to or from the flash memory is done with polling because the process can be interrupted with little disturbance. Further, the polling generates positive control on the timing signals to the flash memory.

The use of two separate DMA modules (the USB DMA module and the Flash DMA module) provides several advantages. First, by including two separate DMA modules, data can be simultaneously written to and read from the memory buffers. Additionally, the separate DMA modules can operate differently and be controlled differently to facilitate data transfers. For example, the USB DMA may be operating on a USB clock and write data to one memory buffer while the flash DMA is reading data out of a different memory buffer. In general, the USB DMA operates under control of the USB signals. In contrast, the flash DMA may operate on a flash clock and be operated by polling.

The structure and architecture given above is only one example of a USB flash memory device. A variety of other structures could be used. For example, larger memory buffers, larger sector sizes, more memory buffers, different numbers of memory buffers and different numbers flash die could be included in the architecture.

The operation and structure of this USB Flash Memory Device is described below to illustrate principles that are applicable to a wide range of flash based memory devices.

As discussed above, a significant portion of the cost of a flash memory device is the flash die that make up the flash memory. Flash die are manufactured using a semiconductor fabrication process. The cost of the flash die is related to a variety of factors, including the defect rate in manufacturing the die. The size of features on the flash die are very small (on the order of 10 nanometers). There are a variety of types of flash memory, including: flash that includes single level cells and flash that includes multilevel cells. Multilevel cell devices can store more than one bit per cell by choosing between multiple levels of electrical charge to apply to floating gates of its cells. The flash die produced by the fabrication process have varying numbers of errors in the architecture that render a portion of memory inoperable. As semiconductor processes evolve to produce finer and finer features, the number of these errors increase. Particularly with multilevel flash die, the number of fabrication errors may render a significant portion of the memory unusable. This can render a multilevel flash die unusable or require that its capacity is downgraded.

The methods and systems below describe principles for identifying the capacity of flash die, assembling the flash die to form a memory device with the desired capacity, and then configuring the memory device to read and write in parallel from multiple die.

An entire block of flash memory is traditionally considered unusable when a single bit in one of the pages in a block is inoperable. Consequently, a defective bit may reduce the storage capacity of the flash memory by 1 megabyte or more. Flash can have a variety of page sizes including 128 pages, 256 pages, or 512 pages per block. For example, this means that for a block with 256 pages where each page contains 8 kilobits, a single bit can cause 256*8096=2072576 bytes (2 Mbytes) to fail. When multiple defective bits are dispersed among many blocks, a flash memory may fail to meet capacity standards and may be discarded. However, many completely functional pages remain within each failed block. As shown below, by identifying inoperable pages rather than inoperable blocks, much of the storage capacity of the flash memory may be reclaimed. This subject matter is described in U.S. Pat. No. 8,122,319 to Charles I. Peddle, titled "Page based failure management for flash memory" which is hereby incorporated by reference in its entirety.

Read and write commands to a flash memory operate on a single page. Erase commands in flash memory, however, must affect an entire block. With the exception of block erase operations, nearly all operations may be performed on a single page. Once the pages in a block are erased, they may be selectively written in a manner that avoids inoperable pages. The principles described in this specification apply even if page mode is not used.

Although the flash memory itself may not include logic to select only operable pages within a block, a memory controller may be configured to identify, select, and operate on only the operable pages. This allows die that would ordinarily be discarded as defective or designated as severely degraded because of a few minor defects to be utilized at nearly full capacity and with extended lifetime. In effect, the memory controller may allow various systems and components access to the storage of the flash memory devices while concealing the complexity of the interface with the flash memory devices. For example, when previously written data in a flash memory device is updated, the old data as well as the new data is written to a new block and the old block is erased. The memory controller may generate and execute the correct sequence of operations to carry out the storage operation. The memory controller may also identify which blocks contain a sufficient number of operable pages to complete an operation. Where data is transferred from a source block to a destination block, the destination block is selected to contain at least the same amount of storage capacity as the source block, but the destination block may still include one or more inoperable pages or sectors.

To track the number of operable pages within each block, the memory controller may build a "good block" table, a "bad block" table or other indicator. The "bad block" table may identify inoperable pages and thus identify operable pages indirectly. The memory controller or other element may then be configured to read and write to any page except those listed as inoperable. The "good block" table may further indicate of operable pages. An ECC module in the memory controller can detect pages that fail during operation of a flash memory device and use mathematical algorithms to recover the data that was lost or altered. Error detection methods used during flash memory operation may include, but are not limited to, generating checksums, comparing checksums, performing redundancy checks, generating parity values, performing parity checks, and executing other error detection algorithms.

Read errors are detected by the ECC, write errors are detected by the flash. If a write error failure is detected in a page by the flash, the error is indicated in a status register. The MPU may then repeat the operation in a new page or otherwise correct the error. Additionally, the ECC module may update the indication of operable pages to exclude any pages that are determined to be inoperable.

When one or more indications are updated, internal operations and data transfers may be completed to hide failures and reconfigurations from systems accessing the flash memory devices and ultimately from a human user of the flash memory devices. Consequently, a failure will not disturb the overall experience of a user and will not require compensation by outside systems. According to one embodiment, this may be accomplished with spare blocks, pages, and/or sectors that may be reserved during an initialization, testing, or other phase. As failures occur, data and addresses for failing blocks, pages, and/or sectors may be replaced by spare blocks, pages, and/or sectors. One or more indications may then be updated to reflect the new logical memory addresses and physical memory addresses for the data. In this way, the flash writes to/from a buffer with only working pages being used as a source or a destination.

In summary, page based failure management in a flash memory controller allows a memory controller to access a "good page" table or other indicator of the functionality of each of the pages within the flash memory blocks. The memory controller can then execute read, write and erase commands utilizing the operable pages in each block, even if the block contains one or more inoperable pages. The use of page mode allows for a significant extension of the life of the flash memory. Further, the use of page mode allows for more efficient use of flash memory that has lower lifetime ratings and/or a higher number of errors. Rather than discard these flash memory chips with errors, these chips can be effectively used and have an extended lifetime in a device that implements page mode failure management as described above.

Figure 2:
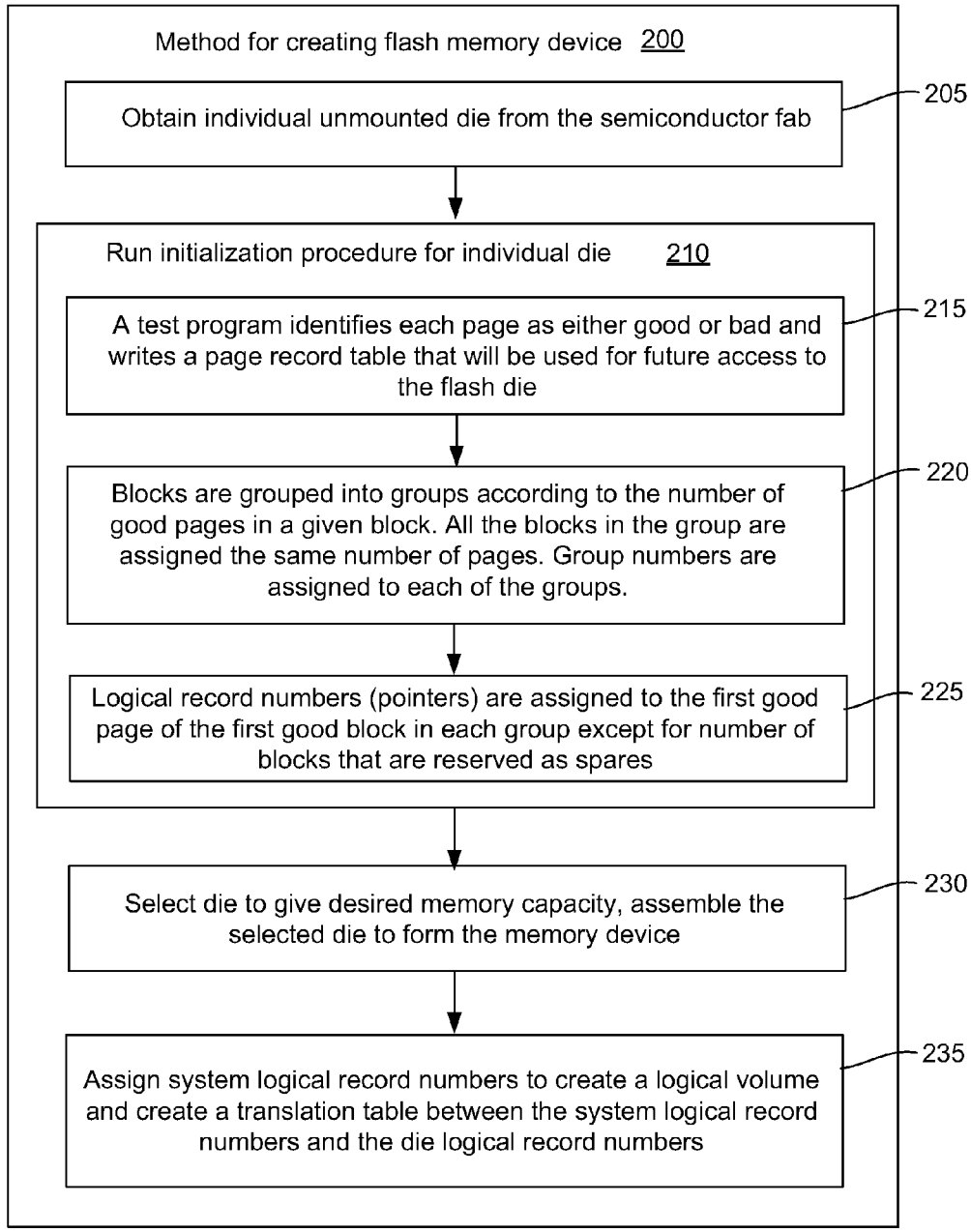
FIG. 2 is a flowchart of an illustrative method for manufacturing a flash memory device, according to one example of principles described herein.

FIG. 2 describes a method (200) for creating a flash memory device that is specifically adapted to use die with reduced memory capacity. Individual unmounted flash memory die are obtained from the semiconductor fab (step 205). As discussed above, memory in flash die is organized into planes, blocks, pages, and sectors. For example, a flash die may contain two planes, with each plane containing thousands of blocks, each block containing a number of pages, and each page containing a number of sectors. While the die are still individual units, a testing system runs the initialization procedure (step 210) to identify each page as either good or bad and writes series of record tables and modified records that are used for page mode access to the flash die (step 215).

In one implementation, failure of a single sector within the page renders the page unusable. The page record table marks good and bad pages within each block of memory. For example, the page record table may set a bit to "1" for a good page and "0" for a bad page within a given block. The page table is used to construct an internal good page table that defines all good pages. The internal good page table is stored in the memory of the die itself.

Blocks are then sorted into groups according to the number of good pages in each block. All blocks in the group are assigned the same number of pages. Group numbers are assigned to each of the groups (step 220). Index tables are further described with respect to FIG. 3. Die logical record numbers (pointers) are assigned to the first good page of the first good block in each group except for the blocks that are reserved as spares (step 225). The die logical record numbers (pointers) for the first good page in the first good block in each group can be used to determine the location/address of the remaining pages in the block and group. For example, a first die logical record number points to a first good page in a block. Using the index table (see FIG. 3 and associated description below) it can be determined that this block contains 256 good pages. The appropriate increment can be added to the die logical record number to address the desired page within the block.

A conceptual example of a index table for one plane of one die is shown in FIG. 3. In FIG. 3 there are 10 groups of blocks. These 10 groups are identified by the number of pages in each block in the group. In the first group there are 4228 blocks, each with 256 good pages. Thus, these blocks contain a full complement of good pages. The first page in the first block is assigned a logical record number of 0, as shown in the first column. The first group contains a total number of good pages equal to 4228 blocks*256 pages per block=1082368 good pages. There are 16 sectors per page, for a total of 17317888 sectors in the 256 group of blocks. A logical record number is allocated for each sector in each block.

The second group (group 254) contains 3345 blocks, each with 254 good pages. Thus, there is a failed page in each of these blocks. When one page fails in a first plane of a die, its companion page in the second plane of the die is also eliminated. Thus, in this implementation, there will always be an even number of good pages in the blocks. The record number assigned to the first page in the first block in the second group is 17317888. This logical record number represents the total number of logical records in the previous group (group 256). This process of grouping blocks with the same number of good pages and assigning appropriate logical record numbers continues until there are less than 10 blocks with the same number of good pages. At this point, 10 blocks that have the most similar number of logical records are grouped together and the blocks are all assigned the number of pages of the block in the group with the lowest number of good pages. For example, group 60 may contain blocks that have a total number of good pages ranging from a maximum of 134 to a minimum of 60. Thus, all the blocks in group 60 are assigned 60 as a number of good pages.

The logical record numbers appropriately index the first good page in the first block in the group. A certain number of blocks are left unaddressed and are listed in an spare block table. These unaddressed blocks are spares used for copying and wear leveling functions further described below.

Specially designated blocks have a distinguishing logical record number ("bb") and contain control information of the controller and for a good page table for that particular die.

During each initial startup (power on), all the blocks are read and their beginning logical record numbers are recorded in a translation table (8k table). The logical record numbers are then indexed from the index table (FIG. 3 below) such that the process described with respect to FIG. 17 (below) can be used to look up addresses of target blocks/pages by referencing the index table.

The method and system described above is only an illustrative example of one method for efficiently handling bad pages within blocks. Alternatively, the blocks could be dealt with on an individual basis rather than in groups. This would significantly increase the size of the index that references the logical records to the blocks. The listing of logical record numbers in FIG. 4 assigns a unique logical record number to each sector. A variety of other techniques could also be used. For example, logical record numbers could be assigned only to pages, each of which contains a predetermined number of sectors.

Now returning to the flowchart of FIG. 2, after the initialization procedure is complete, manufacturing of the memory device begins by selecting die to provide the desired memory capacity for the device. The selected die need not have their full design capacity. The selected die are assembled to form the memory device (step 230). In one implementation, a circuit board serves as the base of the memory device and various die are bonded to the circuit board. In some examples, multiple die may be stacked on top of each other to produce a more compact and efficient device. However, this multilayer device can lead to a higher device failure rate because of the increased number of steps to form the device and the increased complexity of the device. However, the use of page mode and page mode testing allows die with varying capacity (which would ordinarily be scrapped) to be used. In one method, the device is built one layer at a time.

The circuit board is obtained and the first layer of die are bonded and electrically connected to the circuit board. For example, the first layer of die may include one or more volatile memory die, a microprocessor, and one or more nonvolatile memory die. This layer is then tested for operation and functional capacity. If there are one or more errors, the errors can be corrected (if necessary) before continuing. If the errors cannot be corrected, the die or processor is replaced and then retested. The next layer of die can then be deposited over the first layer of die, tested, and repaired if necessary. This continues until all the desired layers of die are correctly placed and functional. This technique has a number of advantages, including more efficient use of die (fewer discarded parts) and an extremely high yield of functional devices.

Part of the page mode process includes testing the chips (as describe above and in U.S. Pat. No. 8,122,319 to Chuck I. Peddle, which is incorporated herein by reference in its entirety) and building a memory device where not all of the die have the same working capacity. As discussed below, the blocks with similar page capacities in a die are divided into groups. For example, blocks with 256 good pages are in a first group and blocks with capacities between 254 and 256 good pages are in a second group and so forth. A first table (group table with die logical record numbers) is constructed for each die.

After assembly of the device, a second table that assigns system logical record numbers is created. This results in a two tiered logical record system, with die logical records indexing the good pages/blocks within a particular die and system logical record numbers assigned to join the various die within the device into a logical volume or volumes and to allow for parallel access to the die (step 235). At the base level, each die has its own die logical record structure using die logical records. This accommodates differences in capacity between different die. The die logical records of the individual die may change as pages with failed bits are removed. All the dies that are to be included in a given device are formatted at one time so that the system logical record numbers are distributed across all the dies. A translation table tracks the relationship between the die logical record numbers and the system logical record numbers. Translation tables are discussed in more detail in FIG. 18 below. In one implementation, the distribution of system logical record numbers across the various die, effectively limits the capacity of the die to the capacity of the least capable memory die because the logical record number assignment stops when all the blocks in the least capable memory die have been assigned. Consequently, it can be advantageous to use die that have similar capacities to form the memory device. However, the assignment of system logical record numbers is not limited to devices that have the same number of groups or the same number of blocks in a particular group. The group tables mask these differences.

Figure 4:
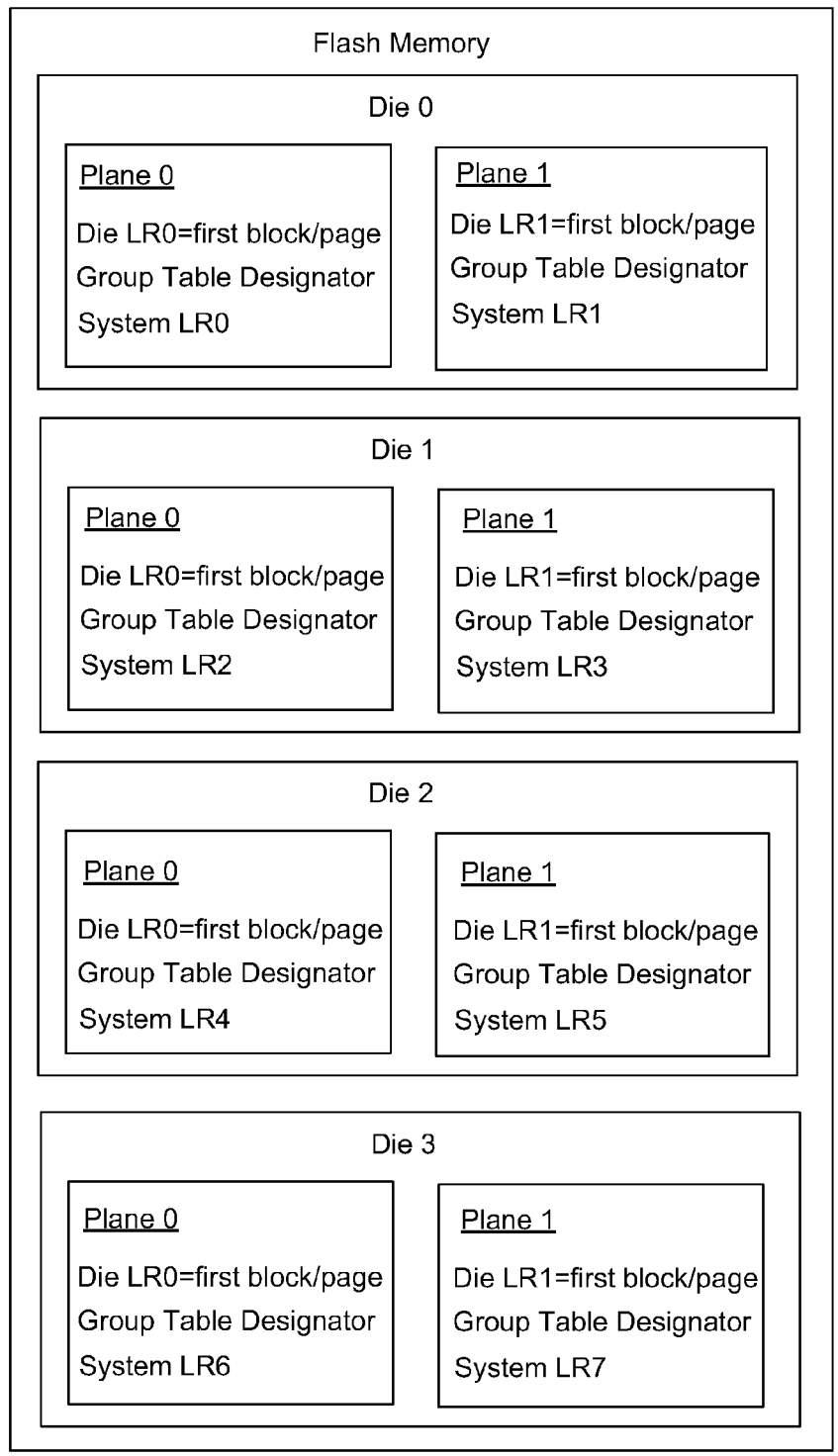
FIG. 4 is a diagram of memory dies that make up the flash memory, according to one example of principles described herein.

Specifically, the system logical record numbers are sequentially distributed ("striped") across the die. The system logical record numbers are distributed through the planes so that a write or read to sequential logical record numbers results in data being transferred to or from a number of planes. This read or write from multiple planes can be performed in parallel, greatly increasing the reading or writing throughput. This distribution of system logical records is graphically illustrated in FIG. 4. FIG. 4 shows one example of a flash memory device that includes four die (labeled Die 0-3) with each die having two planes (labeled Plane 0-1). The memory capacities of these various die are combined to form a single memory volume. FIG. 4 shows only the beginning of the logical record assignment. Specifically, FIG. 4 shows the first die logical record assigned as a pointer to the first good block and the first good page in the block and a index table designator that allows the number of good pages in that block to be identified. The system logical record numbers (System LR 0-7) are striped across each of the eight planes to create a cohesive logical volume.

The die logical records are distributed across both planes in the die, with the even/system die logical records assigned to the even plane (plane 0) and odd die/system logical records assigned to the odd plane (plane 1). An index table designator describes which group the particular block resides in. The system logical record numbers are then striped across all the planes. The first system logical record number (System LR0) is assigned to the first good page in the first plane (plane 0) of the first die (die 0). The first system logical record number (System LR0) corresponds to the die logical record number (Die LR0). The relationship between the system logical record numbers and the die logical record numbers is recorded on a translation table. 8k table is built as start up, as is, then every time you look up the 8k table, looking up to write, you are going to change the block number, end of cycle 8k table is updated. If we down grade a block, it goes to the spare table, and doesn't The second system logical record number (System LR1) is assigned to the first good page (page 1) in the second plane (plane 1) of the first die (die 0). The second system logical record number (System LR1) corresponds to the die logical record number (Die LR1). This pattern sequentially continues through the rest of the die and planes within the die. FIG. 4 shows the assignment of only system logical record numbers LR0-LR7.

The process continues with the assignment of the system logical record numbers beginning with die 0 and plane 0 and repeats until all the system logical record numbers needed to index the flash memory are assigned. The system logical record numbers continue to be written across the die. The die logical record numbers shift according to the number of pages in the blocks and the number of good blocks in a particular die. At some point, a logical record number is written to the last good page on a particular block in a plane/die. The logical record assignment continues by going to a new block on that die quicker than on one of the sister dies that contain more good pages in a block. The overall system is unaware that the usable capacity of the blocks/planes/dies varies because the system logical record numbers are distributed continuously across all the good pages/blocks/planes in all the die. When pages on a die fail, the die logical record numbers shift, but the system logical records remain continuous. The overall system is unaware of the failure of a given page because the die logical record numbers and flash memory transparently compensate for the failure.

As discussed above, a number of blocks may be reserved and therefore not assigned logical record numbers. These blocks may be used as spares which can be substituted for defective blocks, designated as protected portions of the flash or for other purposes.

As illustrated in FIG. 1, the microprocessor (MPU) uses control registers to control various functions in the memory controller. For example, the USB DMA, flash DMA, and error correction code (ECC) module are all controlled by reference values placed in predetermined locations in the control registers.

Figure 5:
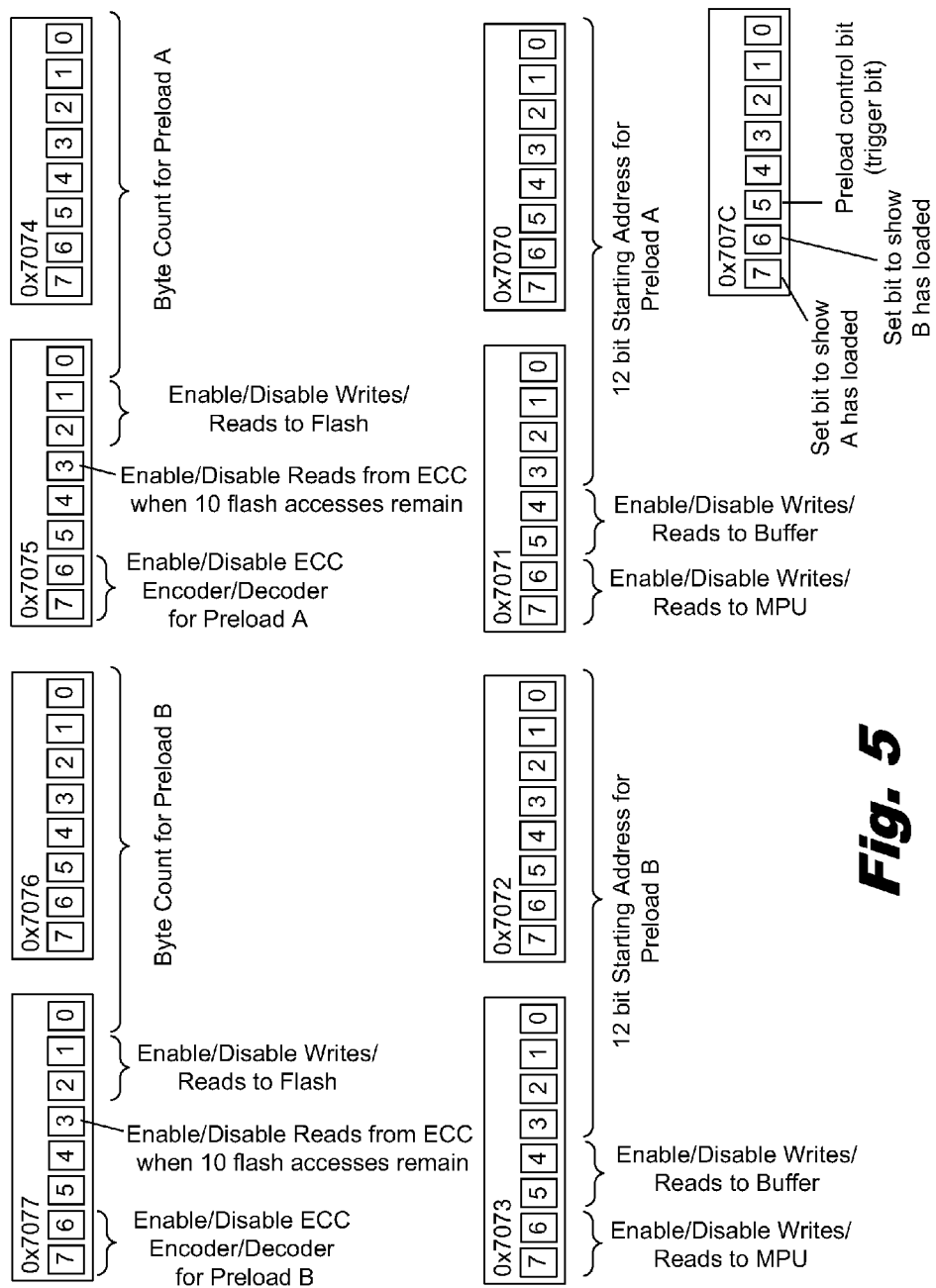
FIG. 5 shows a number of control registers used to control data movement with an illustrative flash interface device, according to one example of principles described herein.

FIG. 5 shows one example of some of the various control registers that control the operation of the flash DMA module. The flash DMA module in this implementation is controlled by registers with addresses 0x707X. Through instructions stored in these registers, the flash DMA can be programmed to make two consecutive data transfers, transfer A and transfer B. In this implementation, both transfer A and transfer B are configured to allow a transfer of 512 bytes. The data in the control registers (0x707X) is designated as being a "preload" for either transfer A or transfer B. The "preload" refers to the data in the control registers that controls the transfers. When the data preloaded in to the control registers is loaded into the flash DMA, the appropriate data transfer can be executed. The content and function of control register 0x7077 is shown in Table 1 below.

TABLE 1

Address = 0x7077
DATA Transfer Count for Preload B

| Bit | Description |
| --- | --- |
| 7 | 1 = Enable the ECC Encoder when Preload B is loaded<br>0 = Disable the ECC Encoder when Preload B is loaded |
| 6 | 1 = Enable the ECC Decoder when Preload B is loaded<br>0 = Disable the ECC Decoder when Preload B is loaded |
| 5 | 1 = Set the Flash Command Output Signal when Preload B is loaded<br>0 = Clear the Flash Command Output Signal when Preload B is loaded |
| 4 | 1 = Set the Flash Address Output Signal when Preload B is loaded<br>0 = Clear the Flash Address Output Signal when Preload B is loaded |
| 3 | 1 = Enable Reads from the ECC Encoder when Preload B is loaded and 10 Flash accesses are remaining<br>0 = Disable Reads from the ECC Encoder when Preload B is loaded |
| 2 | 1 = Enable Reads from the Flash when Preload B is loaded<br>0 = Disable Reads from the Flash when Preload B is loaded |
| 1 | 1 = Enable Writes to the Flash when Preload B is loaded<br>0 = Disable Writes to the Flash when Preload B is loaded |
| 0 | Use this value for the byte count to transfer when Preload B is loaded<br>This value plus 1 is the number of bytes<br>(0x000 = 1 byte, 0x1FF = 512 bytes) |

Bit 0 in control register 0x7077 is the highest bit in a 9 bit byte count for preload B. The remaining 8 bits of the byte count are contained in register 0x7076 as shown in Table 2 below. Bits 1 and 2 in control register 0x7077 enable/disable writes/reads to flash memory. Bit 3 enables/disables reads to ECC module when 10 flash accesses remain. Bit 4 turns on the address latch enable (ALE) that communicates to flash controllers that the bits on the buss are a data address. Bits 6 and 7 enable/disable the ECC encoder/decoder for preload B. This allows the ECC functionality to be selectively enabled when it is needed.

TABLE 2

Address = 0x7076
DATA Transfer Count for Preload B (Low Byte)

| Bit | Description |
|---|---|
| 7-0 | 8 bits of byte count for transfer of data into/out of Preload B<br>This value plus 1 is the number of bytes<br>(0x000 = 1 byte, 0x1FF = 512 bytes) |

The 8 bits in 0x7076 are the 8 bits of the 9 bit counter discussed above with respect to control register 0x7077.

TABLE 3

Address = 0x7075
DATA Transfer Count for Preload A

| Bit | Description |
|---|---|
| 7 | 1 = Enable the ECC Encoder when Preload A is loaded<br>0 = Disable the ECC Encoder when Preload A is loaded |
| 6 | 1 = Enable the ECC Decoder when Preload A is loaded<br>0 = Disable the ECC Decoder when Preload A is loaded |
| 5 | 1 = Set the Flash Command Output Signal when Preload A is loaded<br>0 = Clear the Flash Command Output Signal when Preload A is loaded |
| 4 | 1 = Set the Flash Address Output Signal when Preload A is loaded<br>0 = Clear the Flash Address Output Signal when Preload A is loaded |
| 3 | 1 = Enable Reads from the ECC Encoder when Preload A is loaded and 10 Flash accesses are remaining<br>0 = Disable Reads from the ECC Encoder when Preload A is loaded |
| 2 | 1 = Enable Reads from the Flash when Preload A is loaded<br>0 = Disable Reads from the Flash when Preload A is loaded |
| 1 | 1 = Enable Writes to the Flash when Preload A is loaded<br>0 = Disable Writes to the Flash when Preload A is loaded |
| 0 | Use this value for the byte count to transfer when Preload A is loaded<br>This value plus 1 is the number of bytes<br>(0x000 = 1 byte, 0x1FF = 512 bytes) |

TABLE 4

Address = 0x7074
DATA Transfer Count for Preload A (Low Byte)

| Bit | Description |
|---|---|
| 7-0 | 8 bits of byte count for transfer of data into/out of Preload A<br>This value plus 1 is the number of bytes<br>(0x000 = 1 byte, 0x1FF = 512 bytes) |

Control registers 0x7075 and 0x7074 shown in Tables 4 and 5 serve the same functions for transfer A as control registers 0x7077 and 0x7076 serve for transfer B. For example, a 9 bit counter is formed using the 8 bits in 0x7074 as the lower bits and 0x7075x0 as the upper bit. In control register 0x7073, shown in Table 5, bits 0-3 are the highest bits of a 12 bit starting address for transfer B. Bits 4-5 enable/disable writes/reads to a buffer. Bits 6-7 enable/disable writes/reads to the MPU. Table 6 shows control register 0x7072, which contains the lowest 8 bits of the 12 bit starting address for preload B. Control registers 0x7071 and 0x7070 serve the same functions for transfer A as control registers 0x7073 and 0x7072 serve for transfer B. Control registers 0x7071 and 0x7070 are shown in Table 7 and Table 8, respectively.

TABLE 5

Address = 0x7073
Target Address for Preload B

| Bit | Description |
|---|---|
| 7 | 1 = Enable Reads from MPU Memory RAM40 (0x5000 or 0x4000) when Preload B is loaded<br>0 = Disable Reads from MPU Memory RAM40 when Preload B is loaded |
| 6 | 1 = Enable Writes to MPU Memory RAM40 when Preload B is loaded<br>0 = Disable Writes to MPU Memory RAM40 when Preload B is loaded |
| 5 | 1 = Enable Reads from Buffer Memory RAM60 (0x6000) when Preload B is loaded<br>0 = Disable Reads from Buffer Memory RAM60 when Preload B is loaded |
| 4 | 0 = Enable Writes to Buffer Memory RAM60 when Preload B is loaded<br>Set to enable write to Buffer Memory RAM60 when Preload B is loaded |
| 3-0 | Use this value for the Starting Address for the transfer when Preload B is loaded (High bits of 12 bit address, low bits are in 0x7072)<br>This value plus Base address of the memory selected, is the Address to start the transfer |

TABLE 6

Address = 0x7072
Target Address for Preload B (Low Byte)

| Bit | Description |
|---|---|
| 7-0 | Use this value for the Starting Address for the transfer when Preload B is loaded<br>This value plus Base address of the memory selected, is the address to start the transfer at |

The eight bits in the 0x7072 register and the lowest 4 bits (0-3) bits in the 0x7073 register form the 12 bit starting address for a transfer.

TABLE 7

Address = 0x7071
Target Address for Preload A

| Bit | Description |
|---|---|
| 7 | 1 = Enable Reads from MPU Memory RAM40 (0x5000 or 0x4000) when Preload A is loaded<br>0 = Disable Reads from MPU Memory RAM40 when Preload A is loaded |
| 6 | 1 = Enable Writes to MPU Memory RAM40 when Preload A is loaded |

TABLE 7-continued

Address = 0x7071
Target Address for Preload A

| Bit | Description |
|---|---|
| | 0 = Disable Writes to MPU Memory RAM40 when Preload A is loaded |
| 5 | 1 = Enable Reads from Buffer Memory RAM60 (0x6000) when Preload A is loaded |
| | 0 = Disable Reads from Buffer Memory RAM60 when Preload A is loaded |
| 4 | 0 = Enable Writes to Buffer Memory RAM60 when Preload A is loaded |
| | Set to enable write to Buffer Memory RAM60 when Preload A is loaded |
| 3-0 | Use this value for the Starting Address for the Transfer when Preload A is loaded |
| | This value plus Base address of the memory selected, is Address to start Transfer at |

TABLE 8

Address = 0x7072
Target Address for Preload A (Low Byte)

| Bit | Description |
|---|---|
| 7-0 | Use this value for the Starting Address for the Transfer when Preload A is loaded |
| | This value plus Base address of the memory selected, is Address to start Transfer at |

Figure 6:
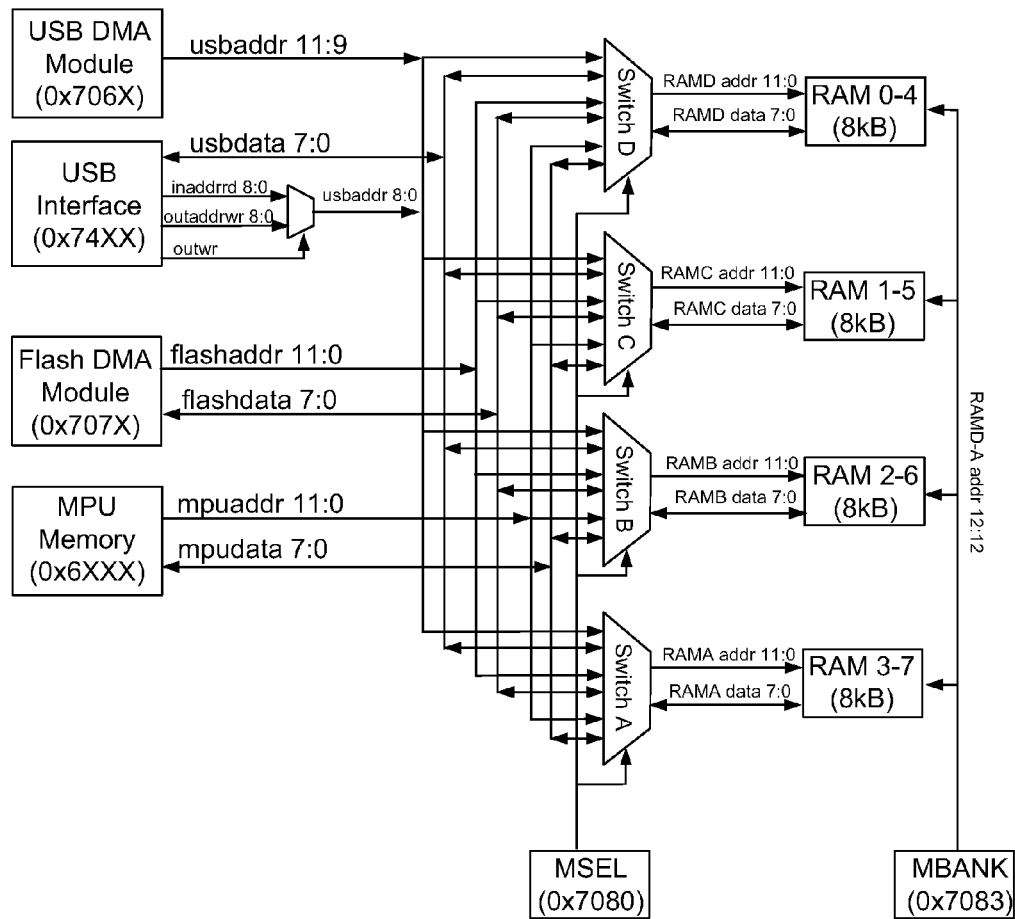
FIG. 6 is a diagram of addressing and data lines within an illustrative USB device, according to one example of principles described herein.
Figure 7A:
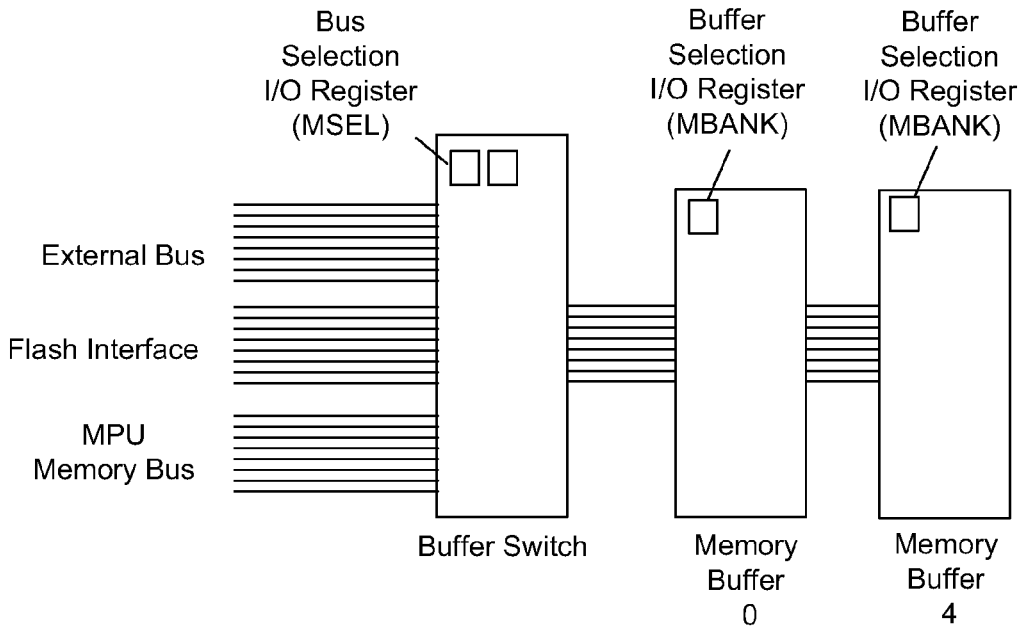
FIGS. 7A and 7B are block diagrams showing the operation of buffer memory and buffer switches in a flash memory device, according to one example of principles described herein.
Figure 7B:
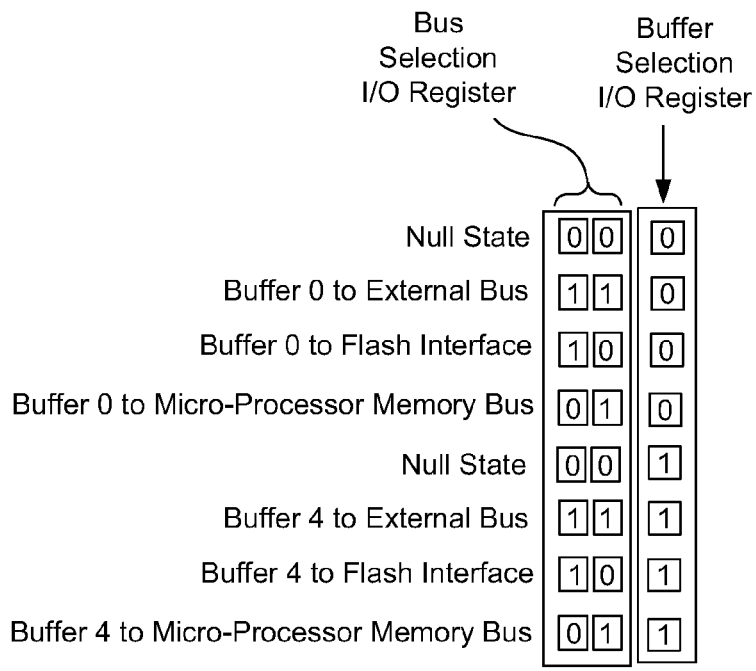
Figure 8:
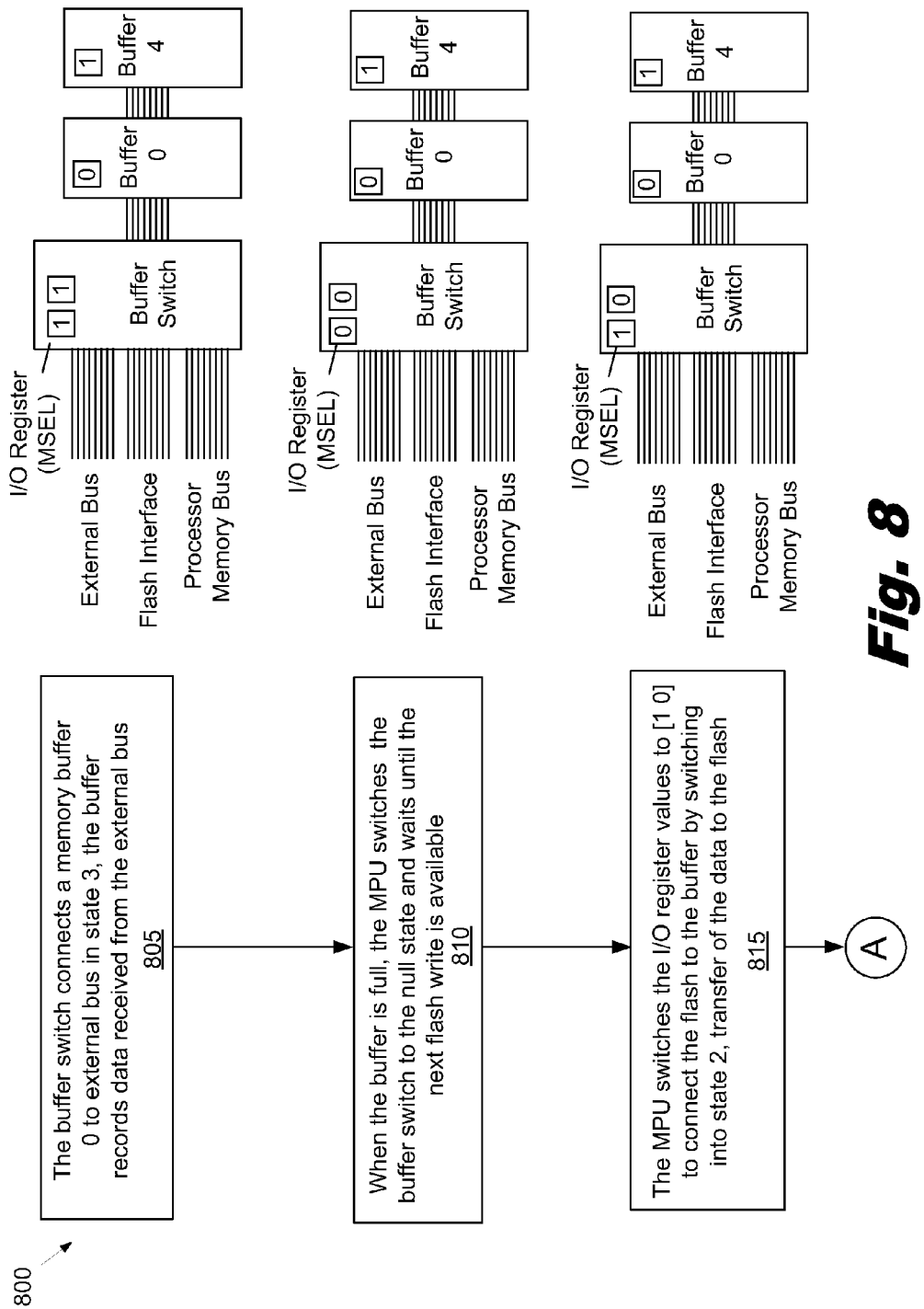
FIG. 8 is a flowchart of an illustrative method for using buffer switches to switch buffer memory access between various data sources/destinations, according to one example of principles described herein.
Figure 8:
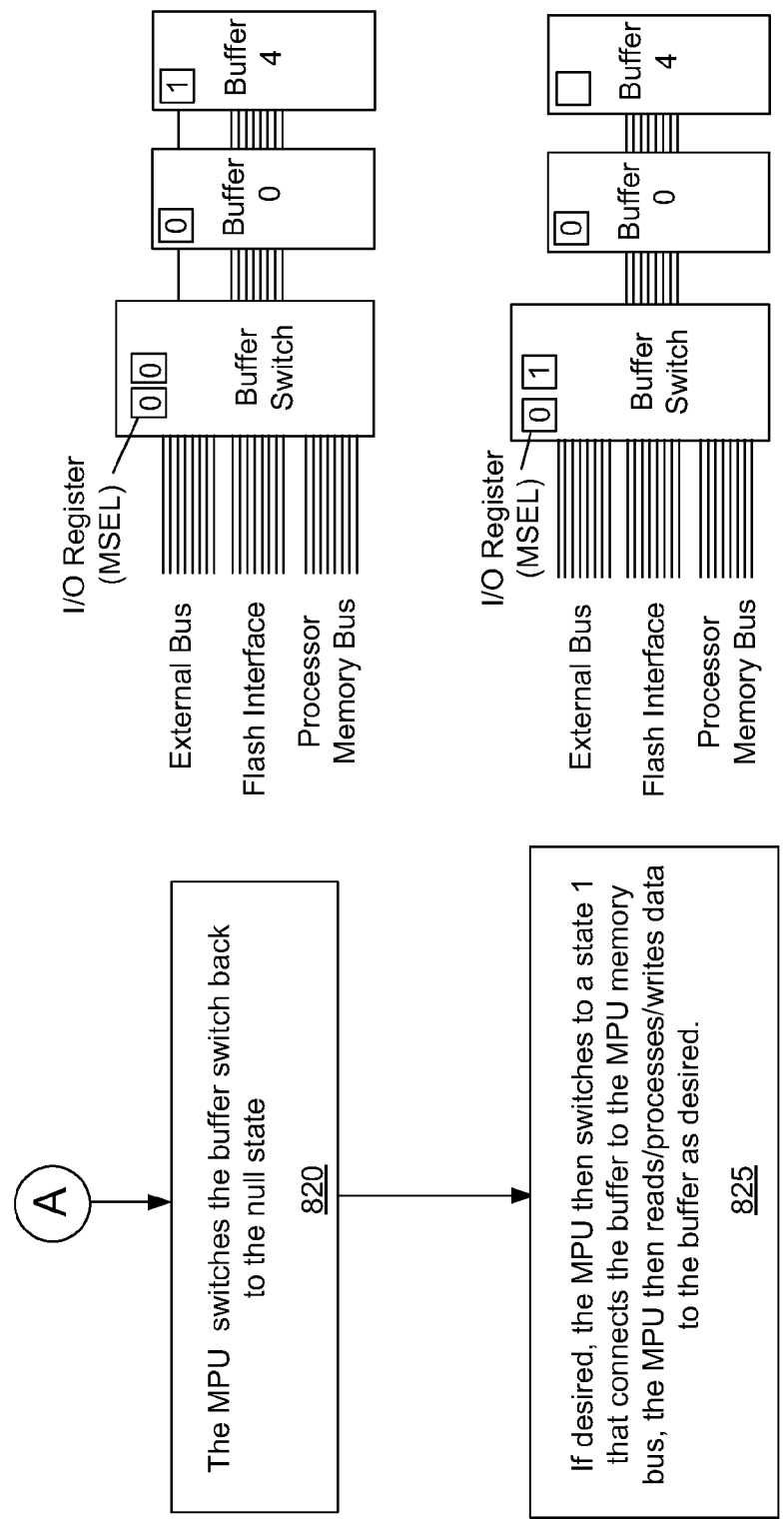

Additional control registers may also be present. In this implementation, control registers 0x707A, 0x707B, 0x707C, 0x707D and 0x707E are present. These control registers are primarily used for diagnostics and troubleshooting, but could be repurposed to meet other needs. FIG. 5 shows only one of these control registers, 0x707C. Bit 5 of 0x707C is a preload control bit or trigger bit. The function of this preload control bit is to enable or disable transfers of the values in the control registers to the flash DMA module. The control bits in the control registers described above are set by the microprocessor unit (MPU) when transfer of the control values to the DMA is disabled. The MPU could go in and adjust these values at any time. In order to allow the MPU to change the bits, bit 5 of 0x707C is written as a "0". This enables the MPU to change the control bits at appropriate times. In order to initiate the DMA functions, bit 5 is turned back to "1". There may be a variety of other control bits that can be used to monitor/control the processes in the USB device. For example, bits in control register 0x707C may be used to specify if transfer A or transfer B, or both are to be performed FIG. 6 shows a block diagram of the data paths within the flash memory device. A simplified version of these data paths is shown in FIG. 1. In this example, a register named MBANK with an address of 0x7083 addresses the four pairs of memory buffers (RAM 0-4, RAM 1-5, RAM 2-6, and RAM 3-7). In this example, each of these memory buffers (RAM 1 through 7) has a size of 4k bytes, with a pair of memory buffers having a size of 8k bytes, or one page. For example, the pair memory buffers RAM 0 and RAM 4 (written as "RAM 0-4") have a combined size of 8k bytes. The memory buffers are connected to switches (Switches A, B, C, and D) by address lines and data lines. These switches may be programmable electronic switches. The operation of a memory buffer and switch are shown in FIGS. 7A, 7B, and 8. The switches selectively connect the memory buffers to one of three different entities: 1) a USB DMA module and a USB Interface via an external bus; 2) a flash DMA module via a flash interface, and 3) MPU memory via a microprocessor memory bus. The USB interface and USB DMA module automatically supply addressing for data transfers from the external bus into the memory buffer. The USB DMA module is controlled by control registers (0x706X). The USB Core (a component of the USB interface) provides 9 bits of address and the USB DMA supplies additional 3 bits to make up the 12 bit USB DMA address. The USB Core is interfaced by control registers (0x74XX). The flash DMA module controls read/write data transfers between the memory buffer pairs (RAM 0-4, RAM 1-5, RAM 2-6, and RAM 3-7) and the flash memory. The flash DMA module is controlled by control registers (0x707X). The MPU memory module controls transfers to and from the MPU memory. An MSEL control register at address 0x7080 controls the switching behavior of switches A, B, C, and D to correctly route the information to the desired location. The MPU uses the MBANK control register to control the switches individually. In this way the MPU can decide individually which memory buffer is in communication with the external bus, flash interface or the microprocessor memory bus. Data lines representing the external bus are shown connecting to the USB DMA module and the USB interface. Data lines representing the flash interface are shown connecting to the Flash DMA module. Data lines representing the microprocessor memory bus are shown connecting to the MPU memory. The labels on the lines designate the number lines that in the bus and the function of those lines The operation of the switches, as controlled by the MPU via the control registers is described in FIGS. 7A, 7B, and 8. FIGS. 7A-7B are diagrams of a buffer switch and its operation. FIG. 7A shows the buffer switch that switches connections to the memory buffers between three different entities: the external bus, the flash interface, and the MPU memory bus. The buffer switch also switches to a null state. In this example, a memory buffer can only be connected to one entity at a time. In order to receive instructions and transfer data, the buffer switch switches according to values stored in a bus selection I/O register. For example, the bus selection I/O register may be the MSEL register shown in FIG. 6. Each buffer switch is connected to two memory buffers. The memory buffers each have a buffer selection I/O register or buffer enable values. For example, the buffer selection I/O register may be the MBANK register shown in FIG. 6. In this case, the memory buffers are designated as memory buffer 0 and memory buffer 4. The values in the MSEL and MBANK registers are written by the MPU.

A fundamental challenge in switching between different buses is maintaining data integrity and not disrupting the memory attached to the bus. Conventional thinking is that it is not possible to switch between buses as described above because switching at the speed required for efficient data transmission will corrupt the data and disrupt the bus communications. Thus, a number of experts in the field have discouraged attempts to create switches that actively connect and disconnect from buses at speeds that would allow for acceptable data transfer rates between different buses.

FIG. 7B shows various bus and buffer selection values in the bus selection I/O register that allow the buffer switch to select various bus connections and memory buffers. In this example, each buffer switch has four different states: a null state, connection to the external bus, connection to the flash memory, and connection to the MPU. Either of the memory buffers can be connected to the buffer switch in any of these four states. In this example, a buffer selection value of 0 selects memory buffer 0 and a buffer selection value of 1 selects memory buffer 4.

FIG. 8 shows illustrative methods (800) for switching between data buses using an electronic buffer switch. Initially, the electronic buffer switch has values [1 1] ("state 3") in its bus selection I/O register and is connected to the external bus (step 805). Buffer 0 is selected by setting the value in the buffer selection register to "0". Data is transferred from the external bus to buffer 0 under control of the USB interface/USB DMA. To allow the flash memory to access the memory buffer 0, the MPU changes values in the bus selection I/O register to the null state [0 0] (step 810). This temporarily isolates the memory buffer and the buses and allows switching transients to dissipate.

The MPU then switches to state 2 by placing the values [1 0] in the bus selection I/O register (step 815). This connects buffer 0 to the flash interface and allows data in buffer 0 to be accessed by the flash memory.

To allow the MPU to access the memory buffer 0, the MPU changes values in the bus selection I/O register back to the null state [0 0] (step 820). This temporarily isolates the memory buffer and the buses and allows switching transients to dissipate. The processor then switches to a state 1 that connects the memory buffer to the processor memory bus and the MPU reads/processes/writes data from/to the memory buffer 0 as desired (step 825). In order to share the register to the MPU, the register has to appear to be a memory location in the microprocessor space. All of the memory buffers can be switched to a memory location accessible by the MPU. For example, a memory location may be designated as 6000. Any memory buffer that is connected to the processor bus at location 6000 can then be accessed by the MPU.

The example given above is only an illustrative implementation. The principles taught above allow for a buffer switch to switch between multiple buses at high speeds without disrupting the bus operation or corrupting the transmitted data. In some embodiments, hardware instead of software may increment the DMA pointer count that acts as an address. When the transfer is done, the hardware sends an interrupt. The system stops sending transfer requests until the control registers are again initialized.

FIG. 9A-9E describes an illustrative method for rapidly transferring data from the memory buffers to the flash memory. In this example, each of the eight memory buffers has a size of 4 kilobytes for a total of 32 kilobytes of memory. The flash memory contains two 8 gigabyte NAND flash die for a total nonvolatile storage size of about 16 gigabytes. Each of the NAND flash die contains an even plane (plane A) and an odd plane (plane B). Each plane has an 8 kilobyte flash buffer that stores data moving into or out of the plane. The page size in the system is 8 kilobytes.

Data from the external data bus is received by the USB interface and sequentially fills the memory buffers. As discussed above, a standard USB interface is designed to transfer data to a single dedicated FIFO buffer. However, in this case, under control of the MPU, the USB interface is "tricked" into writing the data directly to the memory buffers using the same protocols that it uses to write the data to a dedicated FIFO buffer. This makes the data transfer process transparent to the USB interface.

The USB DMA, in coordination with USB interface and under control of the MPU, manages the data transfer into the memory buffers. As discussed above, the USB interface automatically increments the lower bits of the address and sends interrupts to the MPU when each sector is written. The MPU uses the interrupts to monitor the data transfer process and to control the upper bits of the buffer addresses held by the USB DMA.

As soon as a first memory buffer is full, the MPU addresses the registers to change to a different buffer switch according to the process described above in FIGS. 7A, 7B, and 8 to switch the data connection from the external bus to the flash memory. This transition occurs by switching from the external bus to a null state and then from the null state to the internal bus connected to the flash die. However, this transition may occur in a variety of ways, depending on the situation. For example, in some examples the transition from the external bus, null state, and internal bus may not be sequential. For example, a buffer may remain in a null state until a flash die is available.

Data continues to flow into the memory buffers from the bus under control of the USB DMA. In FIG. 9A, the data from the bus is flowing into a second memory buffer after filling the first memory buffer. When the second memory buffer is full, a complete 8 kilobyte page of data has been written to the first and second memory buffers.

FIG. 9B shows the transfer of a page of data from the first and second memory buffers to a first flash buffer in a flash die using the flash DMA under control of the MPU. The flash DMA works in a similar fashion to the USB DMA. The flash DMA accepts instructions from the MPU and autonomously directs the transfer.

Simultaneously, additional data from the external bus continues to stream into the third memory buffer under control of the USB DMA independently of flash data transfer. The flash is being written at its pace which is managed using polling. As discussed above, the flash DMA and USB DMA operate independently and may operate simultaneously, but under control of the same MPU. The MPU sets up the DMA data transfers and then can perform other functions until it receives an interrupt from one of more the DMAs indicating that a transfer is complete. Depending on how many die are in the device and operating in parallel, it is possible for the USB to transfer faster than the controller can store the data because the flash is slower and there may not be enough parallel paths to raise the transfer rate. The MPU then holds off sending requests for more data until it has a register ready for a transfer. The MPU determines the flash transfer is complete by polling the flash. There two reasons for polling: one is to determine if the transfer is complete and a second to determine if the transfer was error free.

FIG. 9C shows that the USB DMA transfer continues to fill the memory buffers from the external bus and is currently in the process of filling the seventh memory buffer. As discussed above, the USB DMA transfer involves control of the USB interface and USB DMA by the MPU.

The flash DMA transfers from the memory buffers to the flash buffers continue each time a pair of memory buffers store an 8 kilobyte page. In FIG. 9C, a flash DMA transfer is in progress from the fifth and sixth memory buffers into plane A of die 2. In other examples, the memory buffers may have different sizes. For example, if the buffers have an 8 kilobyte capacity only one buffer is needed per 8 kilobyte page. Alternatively, the page size may be 16 kilobytes and a 16 kilobyte buffer may be preferred. Matching the page size and buffer capacity results in a simpler system. The more complex case shown in the figures can be used with a variety of page and buffer sizes and is easily simplified when the page size and buffer size are the same.

FIG. 9C also shows that Die 1 is writing the data from its flash buffers to the nonvolatile NAND flash memory in Die 1. When the flash buffers on Die 1 are full, the MPU decides if it is ready to write the data in that buffer to the flash die. If so, the MPU instructs the flash DMA to begin writing the data to the nonvolatile memory in the flash die. Writing to flash is a relatively slow process compared to writing and reading from a volatile memory. In some implementations, the die only writes to NAND flash when both planes are full. Then the data is written in parallel to both planes. However, if there is insufficient data to fill both flash buffers, one plane may write data while a second plane of the same die may be idle. For example, at the end of a file there may not be enough data to fill both flash buffers. If a copy back command (which copies back both pages) is performed, this would still cause the internal flash buffer to write to the odd plane.

This process in FIG. 9C shows all three data transfer operations occurring simultaneously. Data continues to stream sequentially into the memory buffers from the external bus under direction of the USB DMA/USB interface/MPU. Data in full memory buffers is transferred into the flash buffers under direction of the flash DMA/MPU. The relatively slow process of transferring the data from the full flash buffers to the nonvolatile flash continues.

Figure 9D:
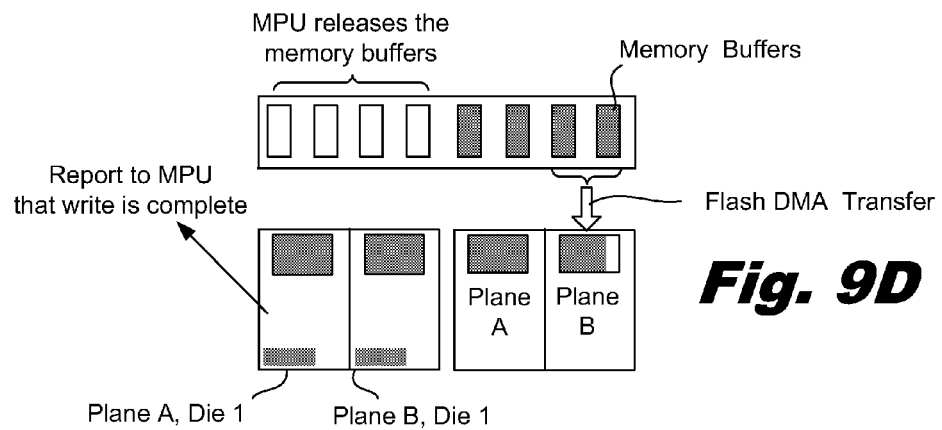

FIG. 9D shows that die 1 has successfully completed writing of the two pages of data into its NAND memory. Die 1 reports to the MPU that the write is complete. The MPU then releases the related memory buffers (in this example memory buffers 1-4).

FIG. 9D also shows a flash DMA transfer from the last two memory buffers into plane B of die 2. Because there are no memory buffers that are free until the MPU releases them, no request is made by the MPU for the next command or sector of data and there is no USB DMA transfer that occurs for a short period of time. In some systems with larger numbers of die and/or memory buffers, the USB DMA transfer can proceed continuously.

Figure 9E:
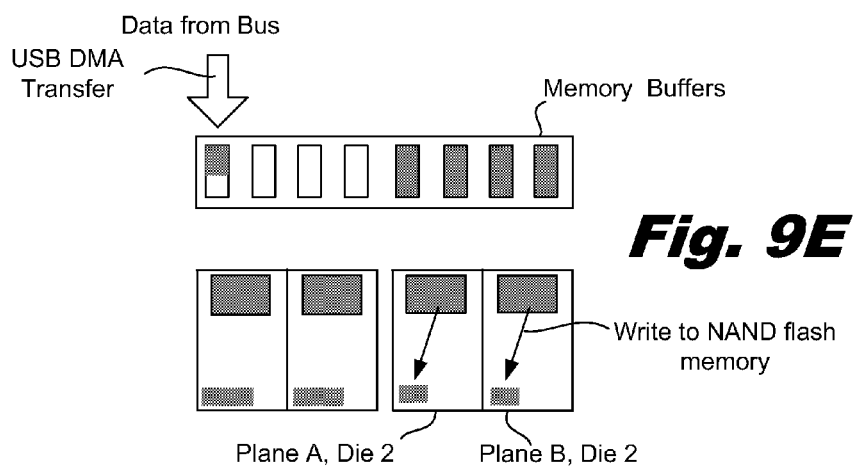

FIG. 9E shows the USB DMA transfer process restarting and data being transferred into the first memory buffer from the external bus. Simultaneously, the data in the flash buffers in die 2 are being written to the NAND flash memory.

Figure 9F:
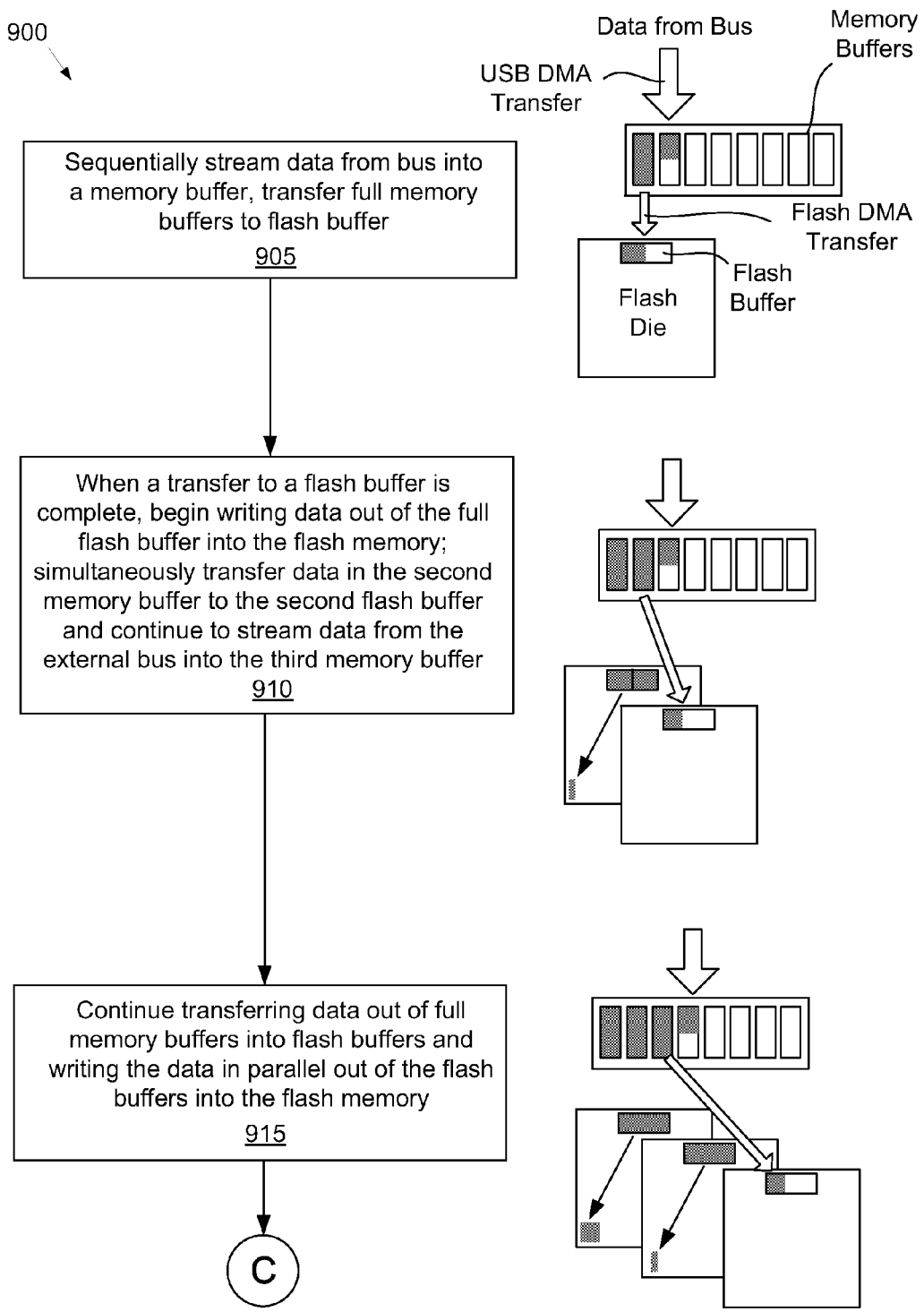
Figure 9F:
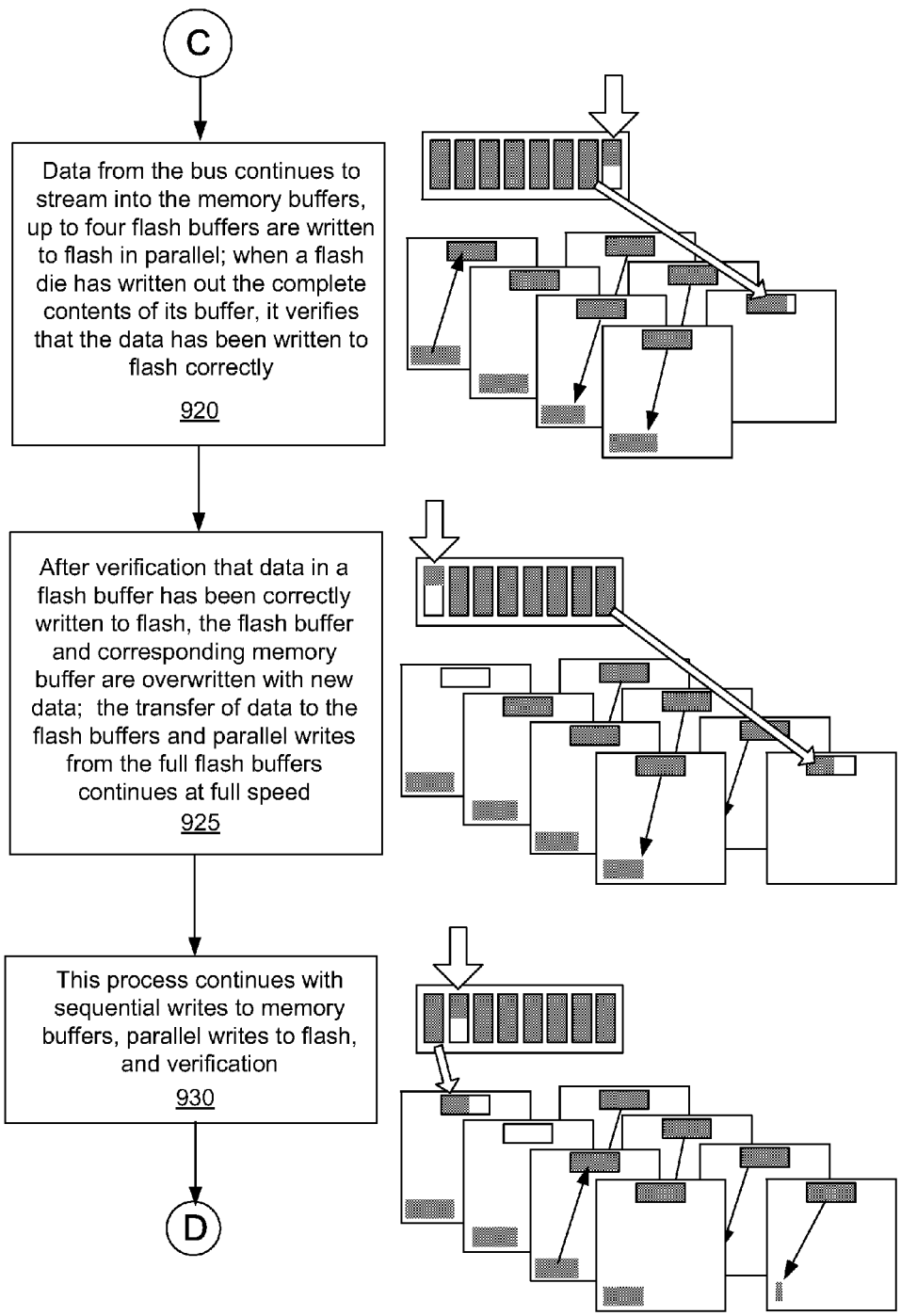
Figure 9F:
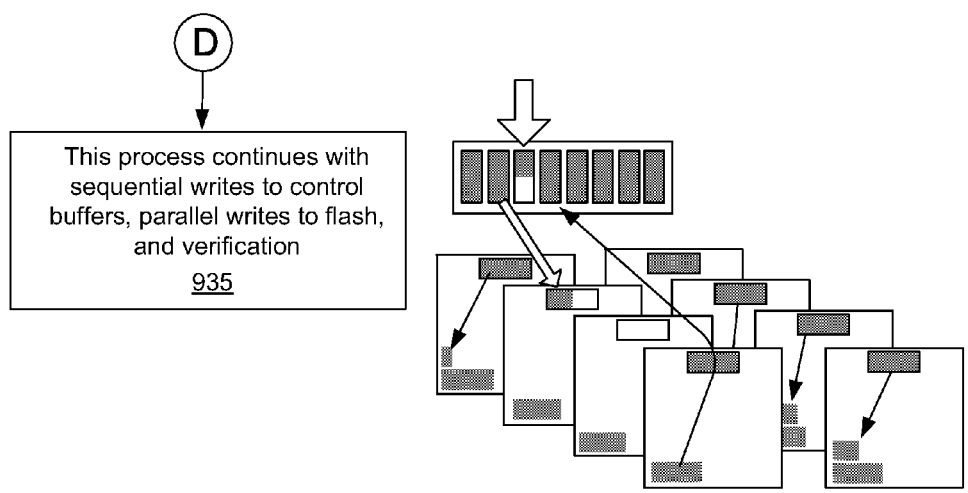

The process described in FIGS. 9A-9E is only one illustrative example for a system that includes two die, 4 kbyte memory buffers, 8 kbyte data pages, and 8 kbyte flash buffers in each plane of the two die. The principles can be applied to a variety of other systems with different parameters. For example, FIG. 9F shows a system that includes 8 kilobyte memory buffers, 8 kbyte data pages, and four die and eight planes each with a single 8 kbyte flash buffer.

The principles described above have a number of advantages, including: the DMA transfer doesn't consume microprocessing clock cycles, flash DMA transfer is not directly tied to USB DMA transfer, and the relatively slow writing to nonvolatile flash memory occurs in parallel. This allows writing to the nonvolatile flash memory at full bus speeds. Further, the data being written can be stored in the memory buffer until the write to flash is confirmed. If the write to flash is confirmed, the buffer can be released. If the write to flash is not confirmed, the data can be written to a different location. This ensures that the data is always successfully written.

The descriptions above are only illustrative and are only examples of systems and methods that can be used. A variety of other methods could also be implemented according to principles described herein. For example, the steps described above could be reordered, combined, eliminated, or additional steps could be added. Additionally, the architecture described above is only an example. A variety of other architectures could be implemented. For example, the implementation described above shows a one-to-one correspondence between the memory buffers and flash die with their associated flash buffers. However, any suitable number of memory buffers and flash buffers could be paired according to their respective memory capacities, transfer speed, and design parameters.

The same principles and methods can be applied to other systems. For example, a high speed bus (such as a SATA bus) may interface with the flash device instead of a USB device. Additionally, there may be any number of flash controllers within the flash device. For example, 2, 4, 6, 8 or more flash controllers may be used in a flash device for parallel operation and higher data throughput. One example of the use of multiple flash controllers operating in parallel within a solid state drive is given in U.S. Pat. App. No. 61/728,394 to Charles I. Peddle, entitled "Solid State Drive Architectures," which is incorporated herein by reference in its entirety. Each of these multiple flash controllers may operate according to the principles described herein. In some examples, the flash controllers may use a schema shown in U.S. Pat. App. No. 61/774,343 to Charles I. Peddle, entitled "File Allocation Table Write Reduction," to minimize the FAT table writes. This application is incorporated by reference in its entirety herein.

Figure 10:
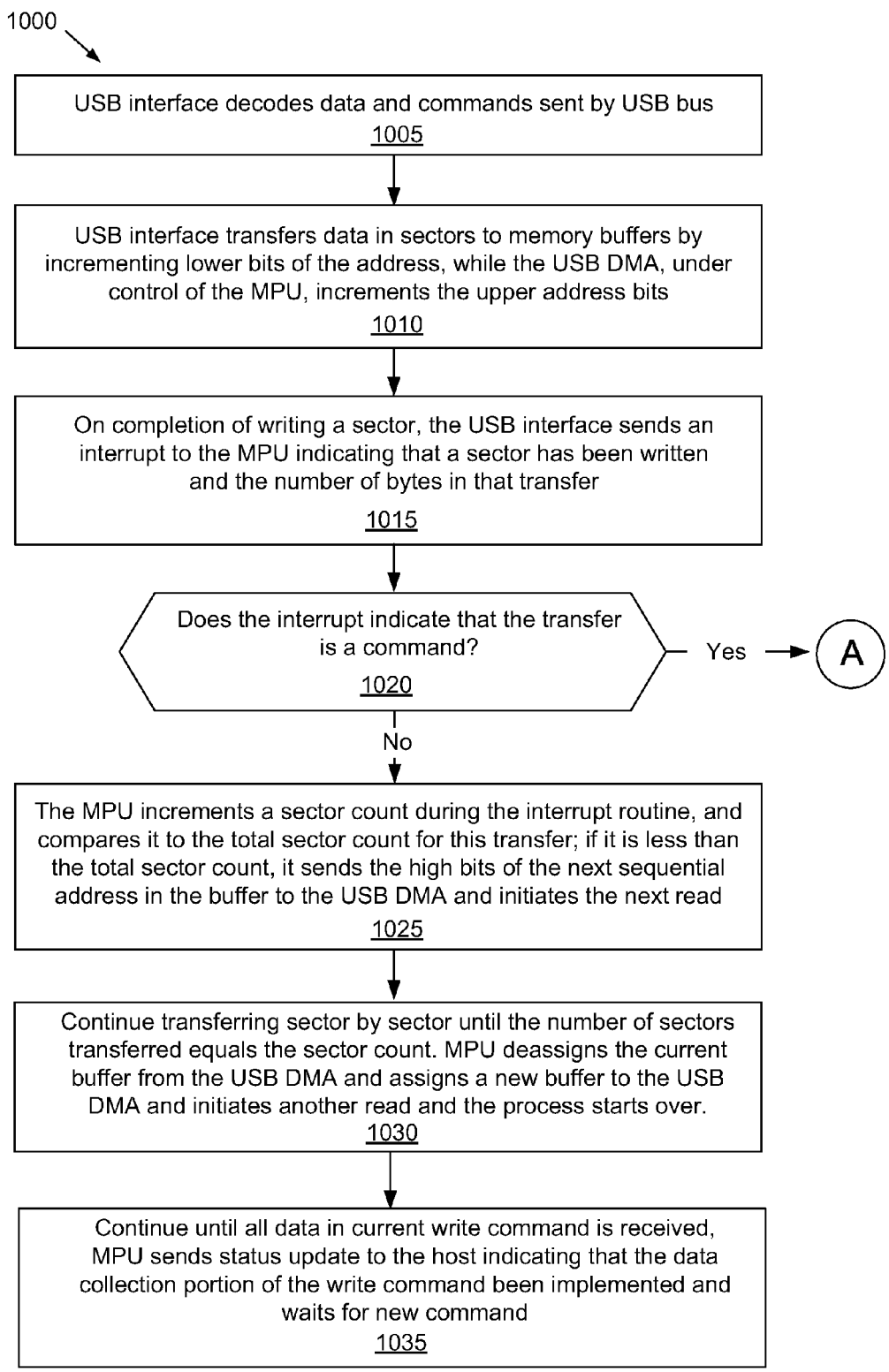
FIG. 10 is a flowchart of an illustrative method for accepting data from a USB bus by an illustrative USB controller, according to one example of principles described herein.
Figure 10:
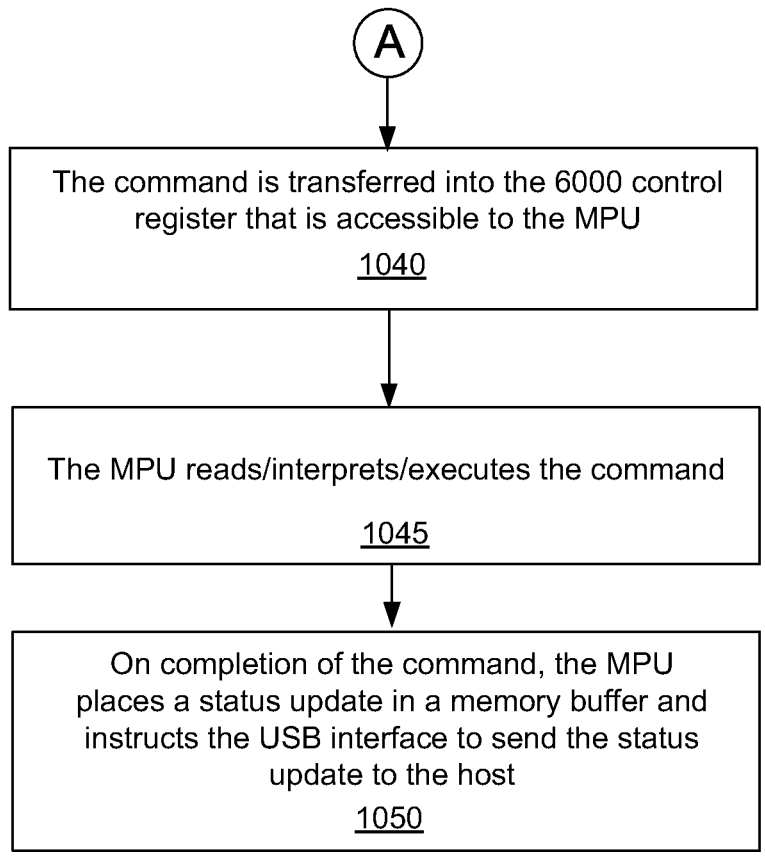

FIG. 10 is a flowchart (1000) that provides additional description of the USB DMA transfer described above in FIG. 9A-9F. The data is sent over the USB bus in sectors, which are typically about 512 bytes in length. The USB interface accepts data and a physical layer (PHY) module within the USB interface that decodes the data. Ordinarily, the USB interface would use an internal address module to automatically increment the addresses as it writes out the 512 bytes of a sector to its dedicated internal FIFO memory. After writing a sector to its dedicated memory, the USB interface sends an interrupt to the MPU in the USB controller notifying it that the internal memory is full. This significantly slows down the data transfer process because the dedicated memory is not directly accessible to outside processes or modules and the microprocessor must stop its operations and respond to the interrupt before the data can be transferred out of the internal memory of the USB interface.

However, in the illustrative architecture shown in FIG. 1 and further described above, the USB interface is "tricked" into writing the data directly into the eight memory buffers. In this implementation, each of the memory buffers has a size of 4 kilobytes or 8 kilobytes. By transferring the data directly into the memory buffers, the data becomes immediately available. Furthermore, memory buffers that are not being currently written to by the USB interface can be accessed by the flash DMA and the microprocessor controller while the USB interface is writing to a different memory buffer. This allows the data to be processed and/or transferred more quickly.

However, the USB interface's internal address module may not have enough addressing bits to address the eight 4/8 kilobyte memory buffers and has no knowledge that it is actually writing to the memory buffers. The USB interface operates just as it would when it transfers data to an internal memory. The USB DMA supplies the higher bits of addresses within the eight 4/8 kilobyte memory buffers under control of the MPU, while the internal address module in the USB interface supplies the lower bits of the address. The MPU receives interrupts from the USB interface as each sector is transferred and uses the interrupts to appropriately instruct addressing by the USB DMA. This transfer is transparent to the USB interface that assumes that it is simply writing to its own dedicated memory. This process is described in more detail below.

Upon receiving data sent over a USB bus, the USB interface decodes the data and commands (step 1005) and transfers the data into the registers by incrementing the lower bits of the address, while the USB DMA, under the direction of the MPU, increments the upper address bits based on interrupts received from the USB interface (step 1010). On completion of writing a sector, the USB interface sends an interrupt to the MPU indicating that a sector has been written and the number of bytes in that transfer (step 1015). If the interrupt indicates that a sector has been written to the USB controller and the number of bytes in that transfer is below a certain threshold, the data is a command (step 1020, "Yes"). If the interrupt indicates that a sector has more bytes than a certain threshold, the data is not a command (step 1020, "No"). When the sector is not a command, the MPU then increments a sector count during the interrupt routine. The MPU compares the sector count to the total sector count for this transfer. If the sector count is less than the total sector count, it sends the high bits of the next sequential address in the memory buffers to the USB DMA and enables the next transfer from the USB to the memory controller (step 1025).

The MPU controls the sector by sector transfer until the number of sectors transferred equals the sector count. The MPU then deassigns the current buffer from the USB DMA and assigns a new buffer to the USB DMA and initiates another read and the process starts over (step 1030).

This process continues until all the data in the current write command is received. The MPU sends a status update to the host indicating that the data collection portion of the write command has been implemented, and then waits for a new command (step 1035). This occurs despite the fact that the data may not yet be written to the flash memory. As discussed above, the data is stored in the memory buffers until it is successfully written to the flash. In the event that a write error to the flash occurs, the data in the buffer and any data in the failed block are written to a different block of memory. Alternatively, the last write from the USB interface is not accepted until the write is complete and error free. The system then sends a status update that triggers the USB interface to accept additional data. If any write error occurs in this sequence the status shows an error, forcing the host to resend the message.

Returning to step 1020, if the data in the memory buffer contains a command (1020, "Yes"), buffer receiving the data is switched to a null state and then set to connect to the MPU (see e.g. FIG. 7A, 7B, 8). This buffer contains the command (see e.g. FIG. 19) which and is available directly to the MPU at location 6000 (step 1040). The MPU reads/interprets/ executes the command (step 1045). If the command is a write-to-flash command, the MPU executes steps 1005-1035 described above. On completion of the command, the MPU places a status update in a memory buffer and instructs the USB interface to send the status update to the host (step 1050).

Figure 11:
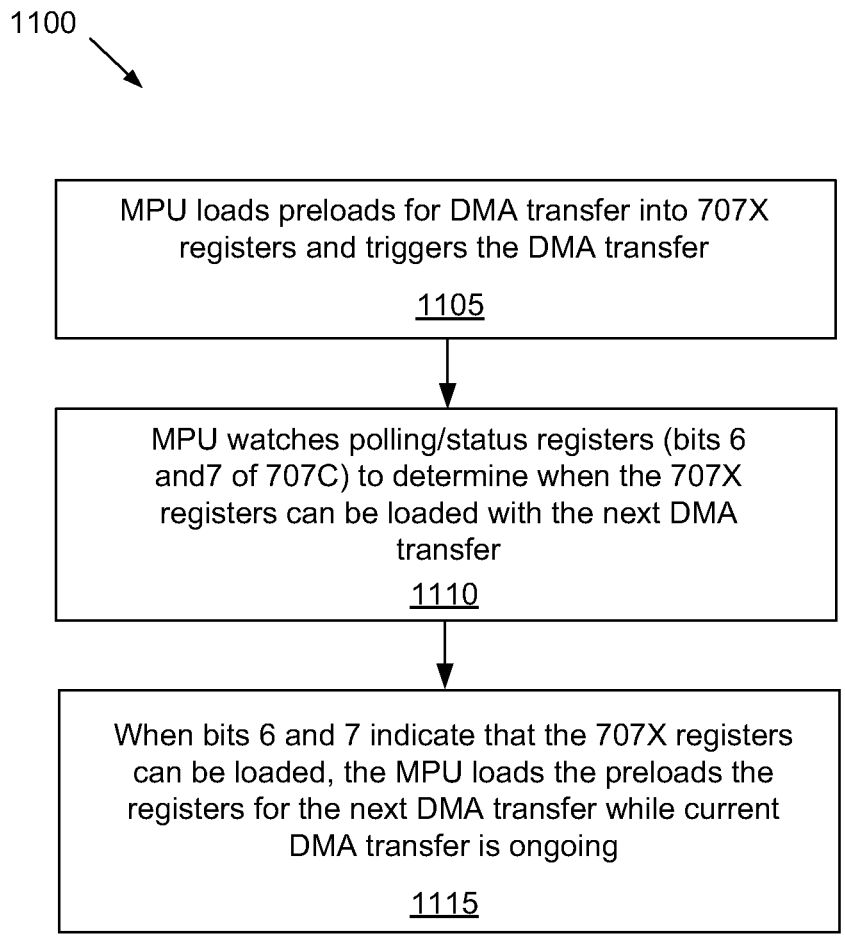
FIG. 11 is a flowchart of an illustrative data transfer process using control registers, according to one example of principles described herein.

Additional description of the MPU operation, as related to the DMA process, is described in flow chart of FIG. 11. As discussed above in FIG. 10, the MPU loads the appropriate control data into the control registers (707X) to set up the DMA transfer and then triggers the DMA transfer to begin (step 1105). The MPU watches polling/status registers to determine the status of the DMA transfer. If polling/status registers indicate that the DMA transfer is ongoing, the MPU can perform other actions including preloading registers for the next transfer. For example, bits 6 and 7 in control register 707C (FIG. 5) indicate when the registers can be loaded with the next DMA transfer (step 1110). When bits 6 and 7 in control register 707C indicate that the register can be loaded, the MPU loads the next set of control values into the registers for the next DMA transfer (step 1115). For example, if a second transfer (transfer B) is indicated, when the 512 counter for the first transfer moves to zero, a load pulse causes the second set of registers to be loaded. By watching the first transfer, the address and count bits for the transfer B can be loaded while the 512 bytes of transfer A are being transferred. Simultaneously transferring data by the DMA and setting up the next transfer by the MPU allows the DMA to run at maximum rate.

In one implementation, the control registers include bits that indicate when the data in the control registers has been loaded into the DMA. Anytime after the data in the control registers has been loaded into the DMA, the data in the control registers can be overwritten by the MPU, even if the DMA data transfer is ongoing. For example, when loading of the register is complete, a "loaded" control bit is placed in bit 5 of control register 0x7070. The DMA can then access the new control data immediately after completing the current transfer. This allows the DMA protocol to smoothly move onto the next operation and update any relevant registers.

The MPU can configure the DMA in a variety of ways. For example, the MPU can configure the DMA to perform multiple consecutive data transfers up to the capacity of the memory buffers. For example, if the memory buffer has a capacity of 16 kilobytes, the MPU could configure the DMA to perform 32 consecutive transfers of 512 bytes out of the memory buffer and into the flash memory. Once this DMA transfer is set up by setting the appropriate values in the control registers there are no additional required actions by the MPU. The DMA module then executes the instructions as contained in the control registers.

Figure 12:
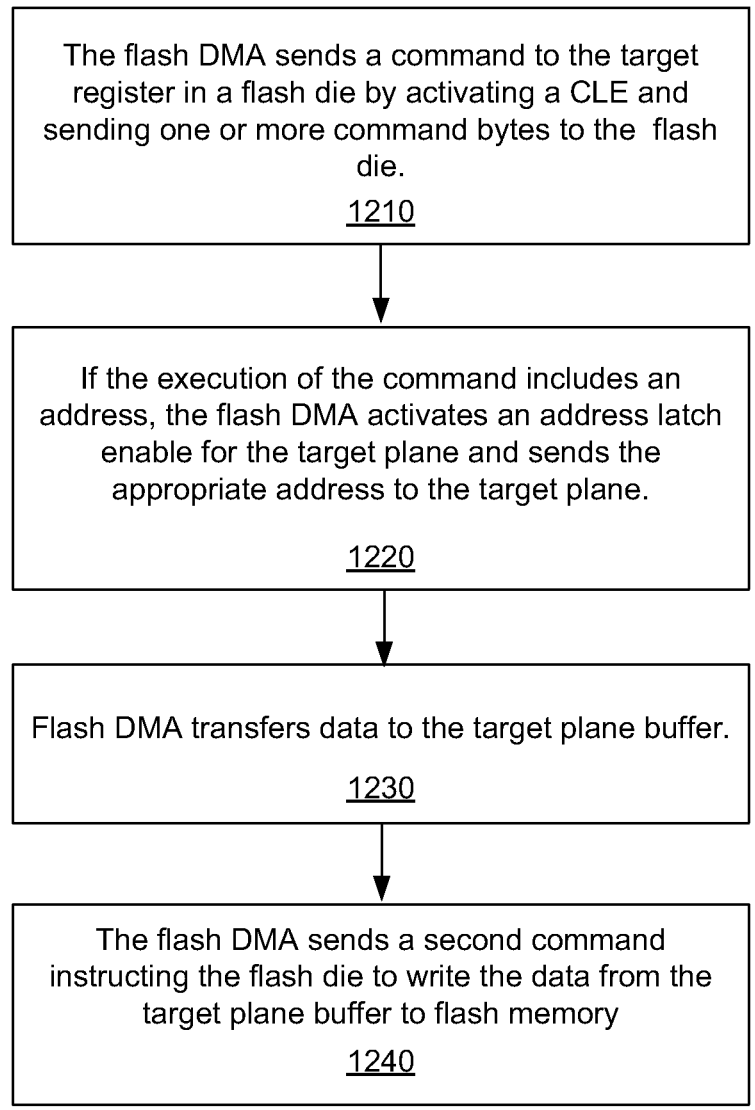
FIG. 12 is a flowchart of illustrative method for communicating between the MPU and flash die, according to one example of principles described herein.

FIG. 12 is a flowchart of an illustrative method (1200) for communicating between the MPU and flash die. All communication is sent through the DMA process with control lines selected by setting the appropriate control bits (see e.g. FIG. 6, FIG. 5). For the flash DMA process to be successful, the flash die must receive any command, addresses or other data that are necessary for the flash die to perform the desired action. In a first step, the flash DMA sends a command to the target register in a flash die by activating a command latch enable (CLE) for a specific plane buffer in the target flash die. While the CLE is activated, the flash DMA sends a command comprising one or more bytes to the flash die (step 1210). Because the CLE is enabled, the flash die interprets the data it receives as a command and configures its operation to execute the command. If execution of the command includes an address, the flash DMA activates an address latch enable (ALE) for the target plane and sends the appropriate address to the target plane (step 1220). This can be done by loading the command pointer in the "a" register and then putting the address and control bits in the "b" register. The address instructs the flash die where to retrieve data from or where to write data received. If an address is given, the transfer starts at that address and sequentially transfers data to higher or lower addresses. If no address is given, the flash die writes the data to the next sequential address.

In some cases it may be desirable for the MPU, in addition to the flash DMA, to communicate directly with the flash die. This is accomplished by writing to the memory location in the control register that is shared by both the MPU and the flash DMA. For example, the memory locations 4000 and 5000 may be shared. For example, control addresses are sent out in 5000, single byte commands 5100, and the address in the memory following 5100.

The DMA cycles to transfer the data to the target plane buffer (step 1230). For example, 8 to 16 DMA cycles can be used to transfer a page of data to the target plane. After the data is received by the flash buffer in the target plane, the CLE is again activated and a command is sent to write the page of data to the NAND flash memory in the target die (step 1240).

In some chip implementations, data can be written to a first plane register. Then the data can be written to the second plane register, and both the planes can be written at the same time. This increases the transfer speed of the chip and provides maximum throughput.

Figure 13:
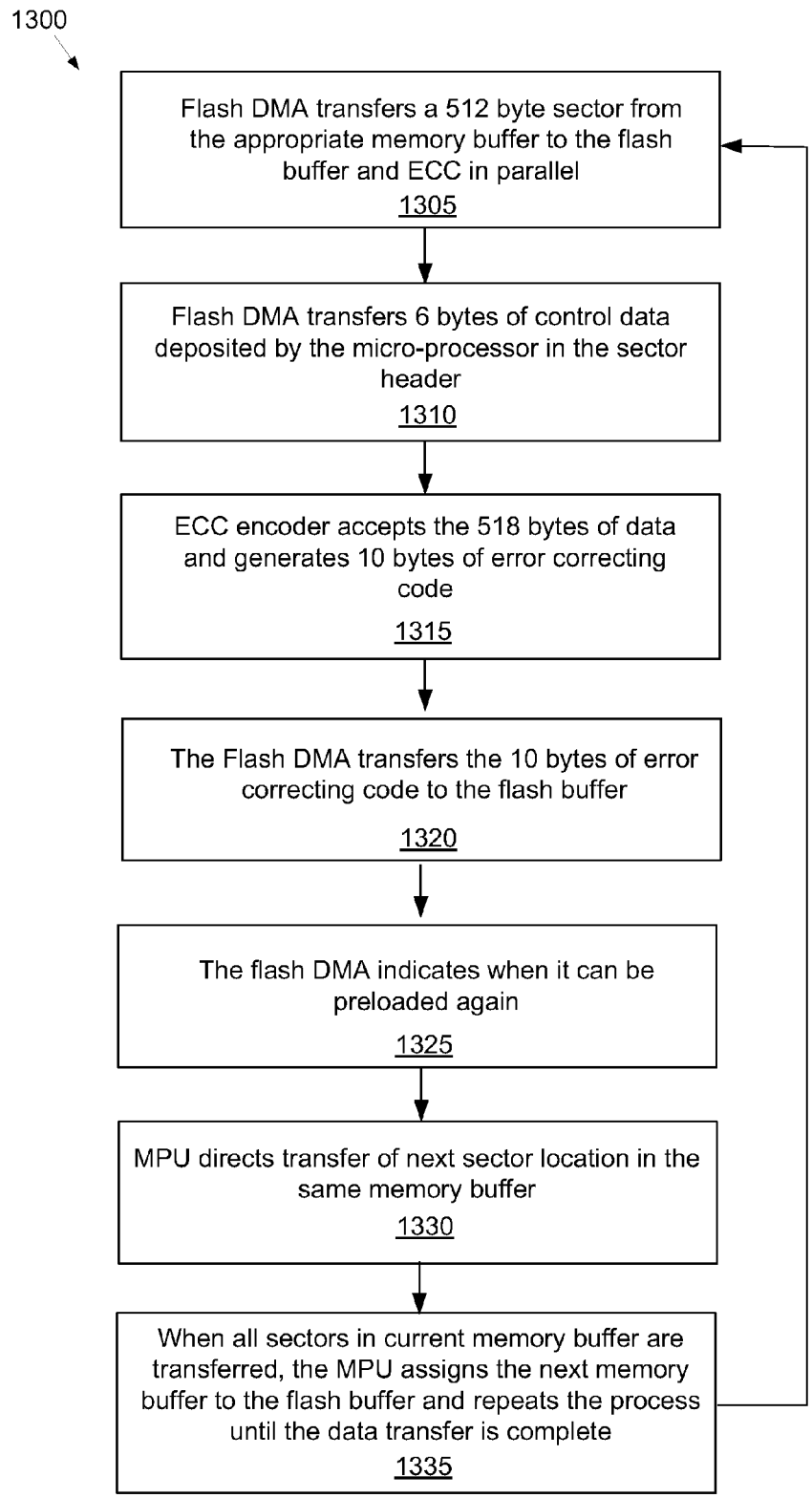
FIG. 13 is a flowchart of an illustrative method for writing data from buffer memory to flash memory, according to one example of principles described herein.

FIG. 13 is a flowchart showing an illustrative method (1300) for writing from the memory buffers to the flash memory registers using the flash DMA and ECC modules. In general, the flash memory is written in 512 byte sector format. The basic data unit of the 512 byte sector format includes 512 bytes of data from the memory buffer and a header that includes 6 bytes of data from the MPU and 10 bytes of data from the ECC module. In other implementations, higher levels of the ECC data can include 256 bits or more. This data is written sequentially to incremented memory locations on the flash and then read back the same way.

For maximum write speed, the 512 byte sectors are stored in memory buffers in groups of either 8 or 16 sectors directly from the USB bus. The memory buffers are configured so that the data stored in an individual memory buffer or pair of memory buffers has the same capacity as a page in the flash memory. For example, if a page in the flash memory stores 16 sectors, then a memory buffer or pair of memory buffers is used to store 16 sectors. This allows a transfer of all the data in a memory buffer or pair of memory buffers to be transferred as a unit to a single flash buffer. As soon as a memory buffer is full, the memory buffer is "turned off" from the USB DMA and prepared to write to the flash using the flash DMA. This process is described above in FIGS. 7A, 7B, and 8. The flash base address and the write command are transferred to the flash DMA from the MPU. To do this, the MPU transfers a preset pointer for the address space into a control register accessible by the flash DMA.

After receiving the necessary data from the MPU, the flash DMA directly controls the data transfer from three separate sources. The flash DMA transfers a 512 byte sector from an appropriate memory buffer to the flash buffer and ECC module in parallel (step 1305). The flash DMA transfers 6 bytes of control data deposited by the MPU in the sector header to the flash buffer and ECC module in parallel (step 1310). The 6 bytes from the MPU include control variables that are used only internally, such as logical record numbers, update value, and wear leveling for the block. The sector headers store 16 bytes for each sector. The sector header addresses are defined by the buffer number which is used as the base index stored in the initial setting of the DMA. Subsequent sectors are written by advancing the sector pointer 512 bytes and the header overlay pointer by 16.

The 518 bytes of data are accepted by the ECC encoder and the ECC encoder generates 10 bytes of error correcting code (step 1315). The flash DMA then transfers these 10 bytes of error correcting code to the flash buffer (step 1320). Thus, one DMA action directly transfers data from three different sources: the register (512 bytes), 6 bytes of information data from the processor memory, and 10 bytes of error correcting code.

The flash DMA then sets a bit in the control register to indicate it is ready to accept a new 512 bytes sector from the memory buffers (step 1325).

The MPU then directs the transfer of the next sector location in the same memory buffer until all sectors in the memory buffer are transferred (step 1330). When all sectors in a current memory buffer are transferred, the MPU assigns the next memory buffer to the flash interface buffer and repeats the process (step 1335). The transfer of the sectors to a particular flash buffer continues to until the page is received and stored. After that, the process moves to the next plane or die to write the next page. This allows for distribution of data across multiple flash buffers connected to different dies. The MPU determines that the transfer is complete when the next memory buffer is empty and/or by comparing the number of sectors transferred against the sector count.

Thus, the data can be written in parallel, with each flash buffer indicating when it has received a page from its paired flash memory. The MPU can then direct data transfers as flash buffers become available. This parallel writing and polling process allows for full speed data transfers between the memory buffers and the flash memory.

Table 1 below summarizes the composition of a page of data transferred using the flash DMA operation.

TABLE 9

Page Arrangement (9168 Bytes per page, 384 pages per block)

| Sector # | Data | Header Value | Group Number | E or F marker | ECC |
|---|---|---|---|---|---|
| 0 | 512 bytes | Logical Record | 1 byte | 1 byte | 10 bytes |
| 1 | 512 bytes | 4 bytes | 1 byte | 1 byte | 10 bytes |
| 2 | 512 bytes | 4 bytes | 1 byte | 1 byte | 10 bytes |
| 3 | 512 bytes | 4 bytes | 1 byte | 1 byte | 10 bytes |
| 4 | 512 bytes | wear value | 1 byte | 1 byte | 10 bytes |
| 5 | 512 bytes | Update value | 1 byte | 1 byte | 10 bytes |
| 6 | 512 bytes | 4 bytes | 1 byte | 1 byte | 10 bytes |
| 7 | 512 bytes | 4 bytes | 1 byte | 1 byte | 10 bytes |
| 8 | 512 bytes | 4 bytes | 1 byte | 1 byte | 10 bytes |
| 9 | 512 bytes | 4 bytes | 1 byte | 1 byte | 10 bytes |
| 10 | 512 bytes | 4 bytes | 1 byte | 1 byte | 10 bytes |
| 11 | 512 bytes | 4 bytes | 1 byte | 1 byte | 10 bytes |
| 12 | 512 bytes | 4 bytes | 1 byte | 1 byte | 10 bytes |
| 13 | 512 bytes | 4 bytes | 1 byte | 1 byte | 10 bytes |
| 14 | 512 bytes | 4 bytes | 1 byte | 1 byte | 10 bytes |
| 15 | 512 bytes | 4 bytes | 1 byte | 1 byte | 10 bytes |
| 16 | 720 bytes | Extra space at end of page used for copy of wear level after erasure of the block | | | |

The page of data includes 16 data sectors (sectors 0-15). Each data sector includes 512 bytes of data, a 6 byte header, and 10 bytes of ECC data. The header includes a header value, a group number, and an "E or F marker." The header value can be used for a variety of functions, including storing the logical record number, wear value, and update value. The logical record number in this example is stored in the header value of sector 0. As discussed above, the logical record number is an index value that identifies the data contained in the sector. The wear value is stored in the header value of sector 4. The wear value indicates the number of times that a particular memory segment has been erased and/or rewritten. As discussed above, flash memory has a limited lifetime. One of the techniques to increase the lifetime of NAND flash is wear leveling, which distributes the use of the memory to ensure approximately equal usage of all the available memory. This prevents premature failure of a portion of the memory due to over use. The wear value is used in the wear leveling process.

The update value is stored in the header value of sector 5. The update value is used to discriminate between an old block and a new block with the same logical record number. This duplication of logical record numbers occurs during updating data in an old block. As discussed herein, the flash memory must write data in a complete block. To update data in an old block, the still relevant data in the old block is copied to a new block (retrieved from the spare table) along with the updated data. During the data transfer, the update value is incremented by one and stored in the new block with the rest of the updated data. Thus, the new block contains the updated data with its associated logical record numbers and the old block contains the outdated data with the same logical record numbers. Having two blocks with the same logical record numbers can lead to confusion. The old block has the lower update value and the new block has the higher update value. Consequently, the update value is used to discriminate between the two blocks and identify the old block for erasure.

The index table designator is the group number for the block as described above with respect to FIGS. 3 and 4. The "E or F marker" field is used for formatting operations. If an F value is in the field, the block has recently been formatted. For example, if the flash memory or drive containing the flash memory has been recently formatted, all of the blocks will have an F in the field. Any block that is written to after formatting will contain an E in the field.

Figure 14:
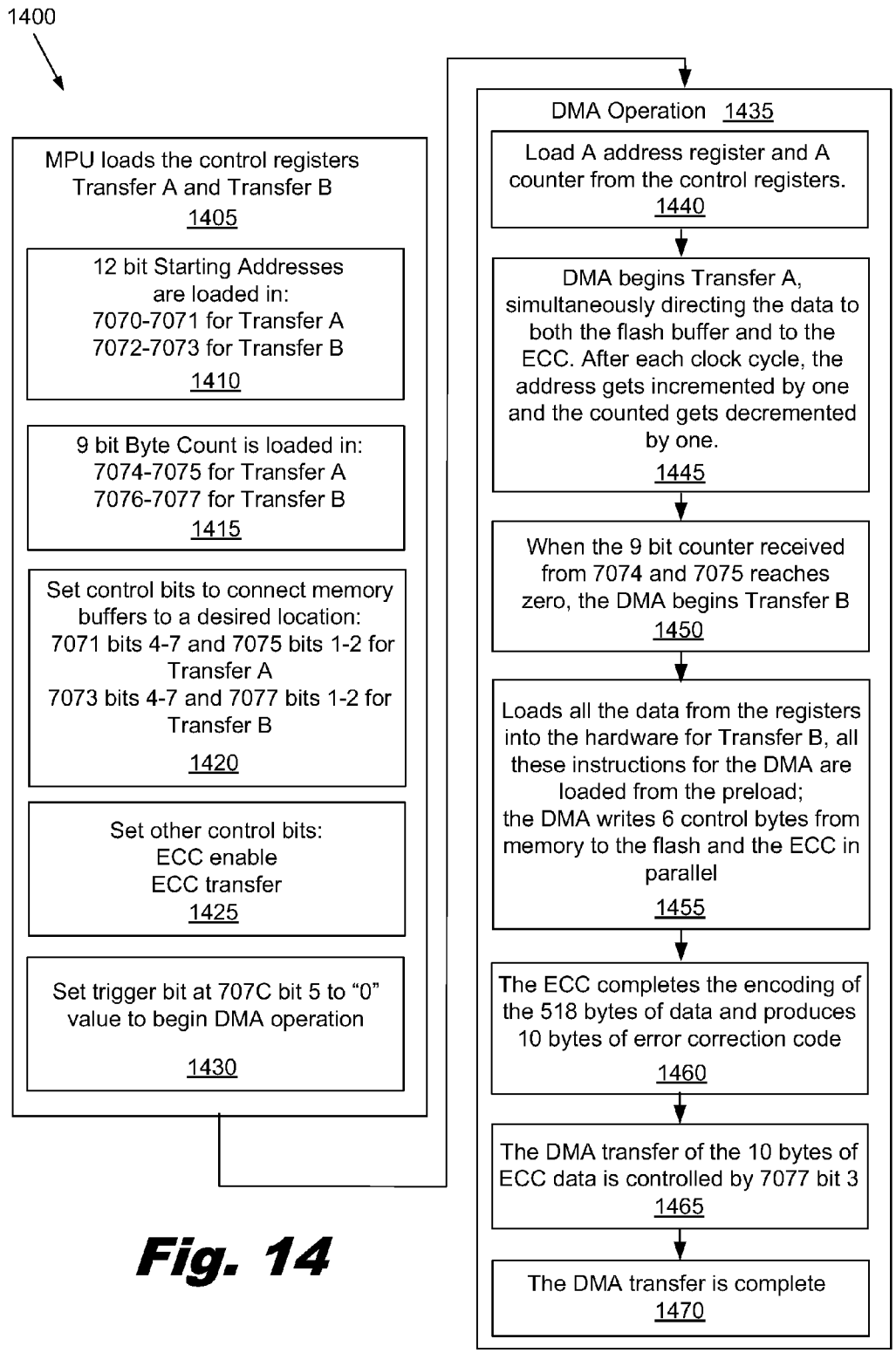
FIG. 14 is a flowchart of an illustrative data transfer processes using control registers, according to one example of principles described herein.

FIG. 14 is a flowchart of an illustrative data transfer process (1400) using control registers to control a DMA operation. For purposes of description, the process described in FIG. 14 assumes a flash DMA write process with 512 bytes of data to transfer from a memory buffer to flash memory. In addition to this 512 bytes of data, there are 6 bytes of information data such as logical record number, wear leveling information, and update values. The write process also includes 10 bytes of ECC data. The 512 bytes of data is transferred in transfer A and the 6 bytes of data information and 10 bytes of error correction code are transferred in transfer B. An example of this data structure is shown in Table 9 above.

The process starts as the MPU loads the control registers for transfer A and transfer B (step 1405). These control registers have addresses of 0x707X and are described in the tables above. Once loaded, the control registers contain all the information required to execute the DMA transfer. The 12 bit starting addresses for transfer A and transfer B are loaded into the appropriate control registers (step 1410). Specifically, the 12 bit starting address for transfer A is loaded into control registers 7070-7071 and the 12-bit starting address for transfer B is loaded into control registers 7072-7073. In this case, the starting addresses designate the specific locations in the register memory that the data will be taken from or stored in. The transfer of a page from the flash buffer to the flash memory is done by successively addressing the page in sequence and the flash recording the data in the same order.

The 9 bit byte counts for each transfer are loaded into 7074-7075 for transfer A and 7076-7077 for transfer B (step 1415). The byte counts designate the amount of data being transferred and can be used to track the progress of the DMA transfer. For example, the byte counts may be decremented as each byte of data is transferred to the designated location.

The MPU sets the control bits so that the memory buffers connect to the desired location (step 1420). The control bits control the switches (shown in FIG. 7A, and FIG. 8). In this implementation, the control bits for transfer A are in 7071 bits 4-7 and 7075 bits 1-2 and the control bits for transfer B are in 7073 bits 4-7 and 7077 bit 1-2. The control bits are used to connect the memory buffers to the flash data bus. Other control bits are also set, such as the ECC enable bits and ECC transfer bits (step 1425). The MPU then sets the trigger bit at 707C bit 5 to a "0" value to begin the DMA operation (step 1430).

Although the steps of loading the control registers are described above as having a specific order, this is only for purposes of description. The control registers could be loaded in any order or in parallel. After the MPU sets these values in the control registers, the DMA operation runs automatically without the need for additional inputs from the MPU. Consequently, the data transfer does not disrupt the MPU operations and is not dependent on the speed of the MPU. While the data transfer operations are occurring, the MPU can perform other tasks. The flash continues to accept the data in the transfer and stores it sequentially.

The DMA operation is then automatically executed (step 1435). The address register for transfer A is loaded from control registers 7070-7071 and the counter for transfer A is loaded from the control registers 7072-7073 (step 1440). The switches are set to transfer the data from the memory buffer to the flash memory by the control bits in 7071 and 7075. The DMA process begins transfer A by transferring data out of the designated memory buffer to the flash memory commencing at the starting address. Each clock cycle transfers one byte of data from the memory buffer to the flash memory. Simultaneously, the data is transferred to the ECC module. All of the controls over direction of the ECC (encode/decode) are loaded when the values from the control register are loaded. After each clock cycle, the address gets incremented by one and the byte count gets decremented by one (step 1445). In this example, the 9 bit byte counter begins with a value of 512. Once a DMA module is loaded with the control values and enabled, it runs to the end of the count loaded.

When the 9 bit byte counter reaches zero, the DMA begins transfer B by loading the control registers for transfer B (step 1450). Transfer B also includes a starting address contained in control registers 7072-7073 and a 9 bit byte counter in control registers 7076-7077. In this case, the byte counter for transfer B has a value of 16. In transfer B, the DMA initially writes the 6 control bytes out of the memory to the intended data location (the flash memory in this example) and to the ECC module (step 1455). The ECC encoder receives the 6 control bytes and completes encoding of the 518 bytes of data it has received. The ECC encoder produces 10 bytes of error correction code (step 1460). As discussed above, this error correction code can be used to check the stored data for errors and to recover the data when an error occurs. The DMA transfer of the 10 bytes of ECC data is triggered by the control bit 3 in the control register 7077 (step 1465). Control bit 3 can be operated in a number of ways. In one example, control bit 3 is set high when the byte count reaches ten. This redirects the DMA from retrieving data from the memory buffer to retrieving data from the ECC module for ten clock cycles. After the ECC data is written to the flash memory the DMA transfer is complete (step 1470). When all of the preload registers are empty, the DMA recognizes that there is no more data to be transferred and turns off the commands and the registers.

In many instances, the next transfer A is loaded during the transfer B so that when the transfer B completes, the next write cycle can begin. The transition between transfer A and transfer B is smooth and direct. Likewise the ECC encoder is timed so that it runs at the same clock rates. Consequently, a 512 data transfer, with its associated header information and ECC bytes takes 528 clocks cycles. The MPU can be alerted to the completion of the transfer in a variety of ways including using interrupts and/or reading a specific value in a control register set by a DMA module.

Similarly, sequential transitions between transfers of multiple sectors are similarly smooth. There is no loss of time or data during the transfers. As discussed above, the MPU can preload the values into the control registers for the next transfer while the current transfer is ongoing.

In addition to data transfer to the flash memory, it may be desirable to transfer commands and address data to the flash controllers. This can be done in a variety of ways. In one implementation, flags are set in the control registers to notify the flash that the data on the data line is an address or a command. For example, bits 4 and 5 of control registers 7075 and 7077 can be used to designate to the flash that the data on the line is an address or a command. Specifically, for transfer A, bit 4 of control register 7075 is set when data on the data line is an address and bit 5 is set when the data is a command. Similarly, bits 4 and 5 in control register 7077 are used to designate an address and command data for transfer B.

The preceding description describes various principles that can be used for rapid write and read access to flash memory. However, for various reasons a write operation to flash memory may potentially fail. While the USB interface and USB DMA are storing the incoming data in one memory buffer or pair of buffers, the flash DMA is unloading other memory buffers to the flash die. As discussed above, the data is held in the memory buffers until it is correctly written to the flash. If the data is not correctly written to a target block in the flash, the data is rewritten to a different block. For example, the data stored on the failed block may be copied to a new block and the additional data stored in the memory buffers may be added during the copying process. The failed block is then downgraded and erased and becomes a new lower capacity spare block. For example, 8 pages are written to 8 different planes in four different die. The third page comes back with an error. In this case, everything that was previously written to the failed block is copied to a new block. The data stored in the memory buffer is copied to the new block. If this is successful, the remaining data from the failed old block is copied. Only if the complete process is successful, is the memory buffer released to be over written. In some implementations, performing this recovery from a write error takes a minimum of 50 milliseconds.

Figure 15A:
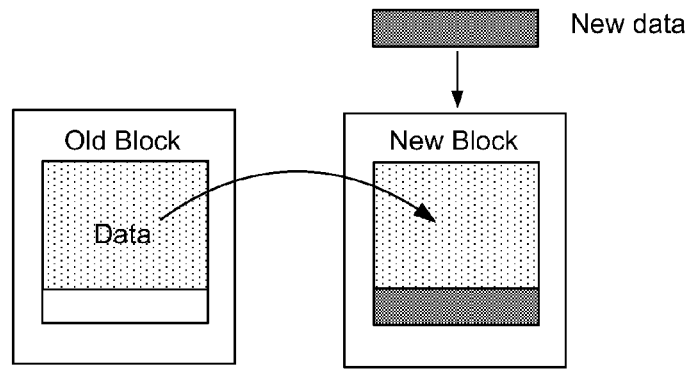
FIG. 15A is a diagram of a standard method for writing new data to a block, according to one example of principles described herein.

When data is written to a block that is empty, the data is written directly into the block. However, when a block has some stored data and it is desirable to write additional data to the block, a "copy back" procedure can be used. FIG. 15A shows one example of the "copy back" method for writing additional data to a memory block. On the left, an "old block" is shown that is partially filled with data. To add additional data to the data that is stored in the old block, the data is read out of the old block and copied to a new block, shown on the right. After all this data is copied to the new block, the additional data is appended to the end of the data stored in the new block. Any additional data that is contained in the old block then copied into the new block. This technique introduces several undesirable effects. First, by copying the data to a new block, the technique causes an additional erasure of the old block. This undesirably reduces the lifetime of the old block. Second, the process is slow because it takes time to copy all the data out of the old block and write it into the new block.

Figure 15B:
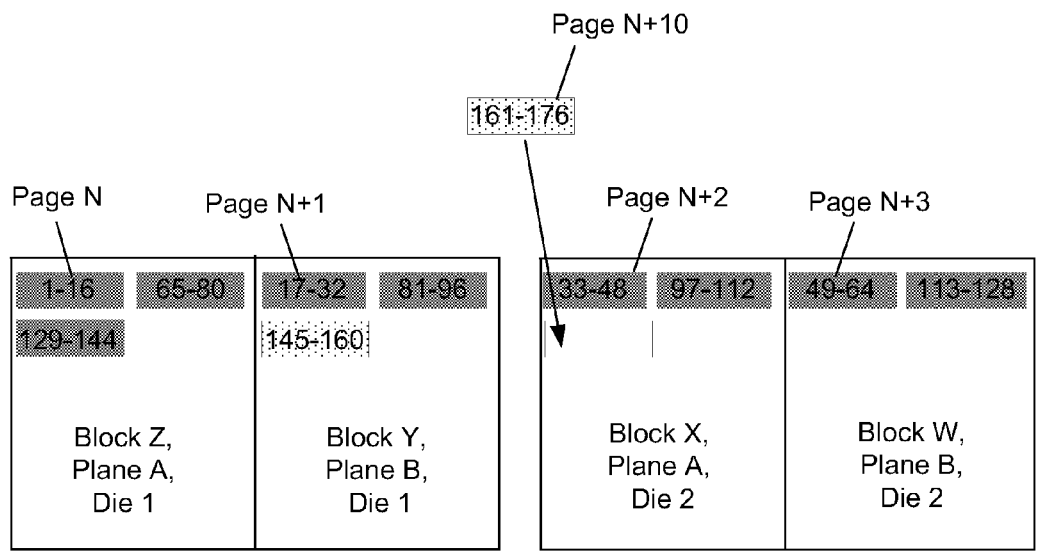
FIG. 15B is a diagram showing an illustrative method for writing a new file to flash without copying data already present in a block, according to one example of principles described herein.

FIG. 15B shows an alternative technique that eliminates copying and writing of old data when new data is being written. FIG. 15B shows four different blocks: block Z on plane A of die 1, block Y on plane B of die 1, block X on plane A of die 2, and block W on plane B of die 2. In striping, pages are written sequentially across the die. In this example, each page includes 16 sectors. Page N includes sectors 1-16 and is written in block Z, plane A, die 1. Page N−1 includes sectors 17-32 and is written in block Y, plane B, die 1. Page N+2 and page N+3 are written in the same manner so that the data file is striped across both die. The writing of the file then returns back to block Z, plane A die 1 for writing of the next page. This page will start with the next consecutive sector, which is 65 in this example. The writing of the first data file continues until all 144 sectors of the first data file are written. This enables parallel read and write operations. The first data file is shown in dark shaded boxes.

At some later time, additional data needs to be written to the flash memory. This additional data is not a modification of the initial data file, but may be data that needs to be appended to the initial data file or a separate new data file. Instead of copying portions of the initial file stored on blocks Z, Y, X, and W to new blocks and adding the new data during the transfer process, the new file is written at the next available logical record number (145 on block Y) and distributed across the blocks. This negates the need to copy the data from the blocks to new blocks and the need to erase the old blocks. Further, the process of writing new data to the memory can be significantly faster because no copying process is required. This process does not violate the operational constraint that blocks must be written and read from sequentially. Whenever possible logical record numbers can be sequentially assigned to the same block in the even plane and the odd plane so that the two planes can be written together. In the case of memory that includes three layer cells (TLC), three pages will be written in the same set of cells. This allows all three pages to be written and read at the same time. If you write two planes simultaneously, then six pages can be written and read at the same time.

When dealing with die that have been striped with data, if additional data files are added, they are simply appended to the last page that was written. If a copy back procedure is necessary, only the data in the blocks that is written is transferred to a new block. This can save a significant amount of time because the whole block doesn't need to be copied, only the pages within the block that contain data.

Figure 16:
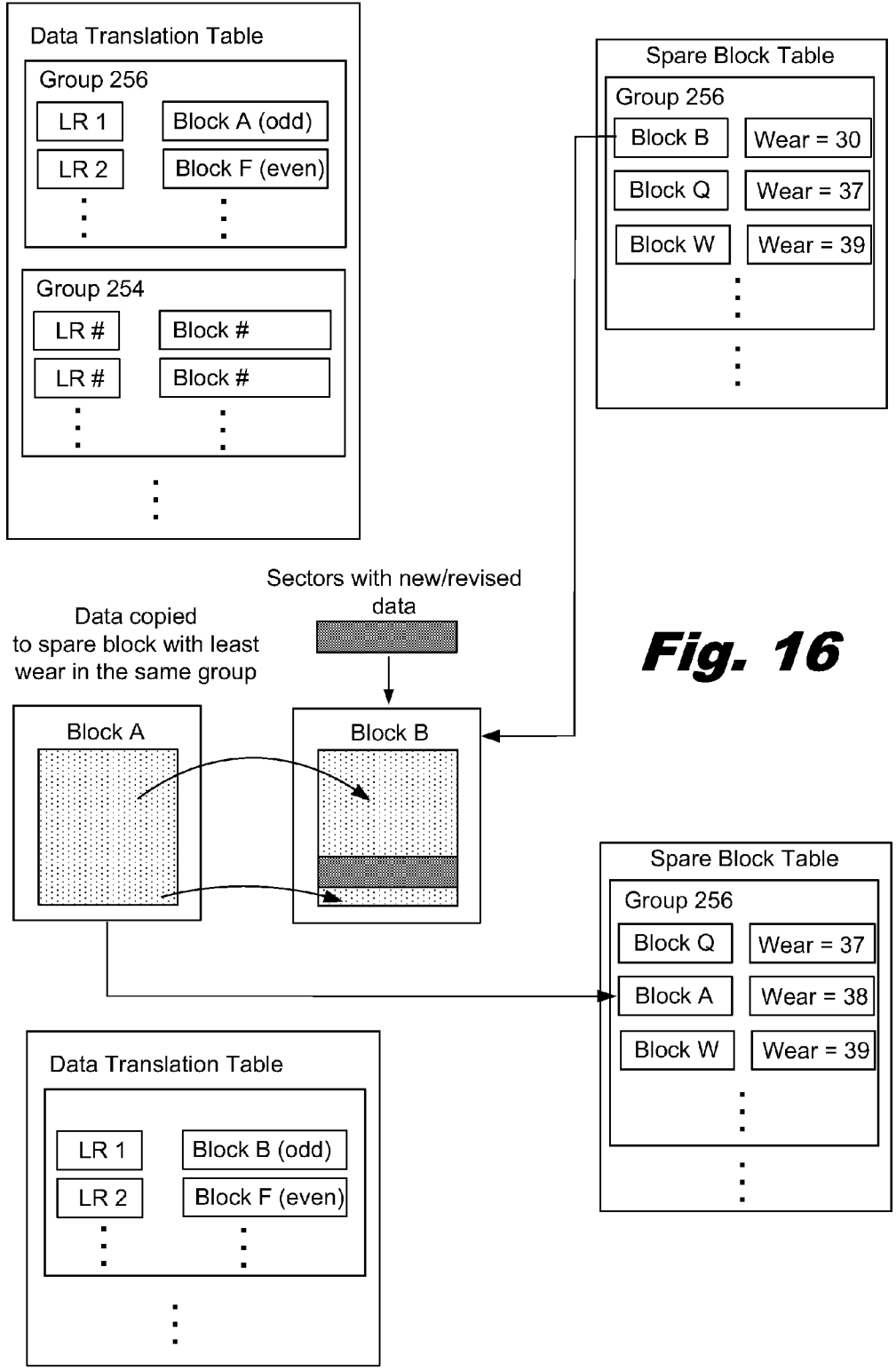
FIG. 16 is a diagram showing the use of a data translation table and spare block table during the updating of data contained in a memory block, according to one example of principles described herein.

The process is different when data written on a block is modified. FIG. 16 shows an illustrative method for managing write operations that modify data existing within the flash. When data is written to the flash that updates already existing information, the original data in the block is copied to a new block and the changed data is added to the copied data in the new block. To track which logical record numbers are associated with which block, a data translation table is used. The data translation table is generated during boot up of the computing device and stored in the RAM. The data translation table is dynamically updated to maintain the mapping between the logical record numbers and the blocks. In the example shown in FIG. 16, the data translation table segments the logical record numbers and their corresponding block numbers into groups. These groups correspond to the block groups shown in FIG. 4. For example, the first entry for group 256 is shown in FIG. 16 as "LR1" which corresponds to a Block A (odd).

In this scenario, block A contains data which has been changed by the MPU during processing and needs to be updated. To update the original data in block A, a spare block from the same group in the spare block table is identified. If no block is available in the same group, the process looks for a block in the next group with a higher number of available pages. The spare block table is a listing of blocks that are erased and are specifically set aside for receiving updated information. The spare block table orders the available spare blocks ascending by group and in order of wear within the groups, with the blocks that have the least wear listed first. The blocks that are listed first are then used first. This is a wear leveling technique that ensures that blocks with the lowest wear are written to first. In this example, Block B has wear of 30, indicating that it has been erased 30 times. Block Q has a wear of 37 and block W has a wear of 39. Block B has the least amount of wear and is selected to be used for updating the data originally stored in block A.

To update the data in block A, the unchanged data from block A is copied to block B, and the new/revised data received from the CPU is inserted at the appropriate location. Additional data from block A is copied to block B after the sectors with new/revised data are copied. In some implementations, each change of data can trigger 128 to 256 writes to new blocks. When the write is complete, the MPU monitors the status of the flash by periodically sending a command to the flash asking if the flash has completed the current command. If the flash is done, the flash responds by sending a status signal that indicates that the flash is ready for the next command. Block B now contains a complete version of the updated data. The data translation table is updated to have logical record 1 point to block B that now contains the updated data. Block A is then erased and its wear level data incremented to reflect the erasure. Block A is then indexed in the spare block table in an order that reflects its level of wear. In this example, Block A has been erased 38 times and is ordered between block Q which has been erased 37 times and block W which has been erased 39 times. The wear level is written in the flash in the block by opening the last page in the block and writing wear level in the last portion of the page (see Table 9). The writing of the wear level can be out of sequential order because the wear level is written to a designated location that is not used to record standard data (sector 16).

The descriptions above describe a write operation from the buffer memories to the flash memory. Although the examples above describes a write operations from a memory buffer to a flash memory, the flash DMA process can also be used to transfer data out of the flash memory and into the buffer memories. First, the designated amount of data is transferred out of the flash memory, beginning at the designated address and into the flash buffer. Then, the DMA transfers the designated amount of data out of the flash buffer. In this case, the ECC decoder could be enable to detect any errors in the data. If there are only a few errors, the ECC can correct the errors. The DMA simultaneously transfers the data to the memory buffer and ECC decoder. When the data is read, the full 528 bytes have been read into the ECC decoder. In the example given above, a 78 bit ECC algorithm is used. However, a variety of other algorithms could be used. For example, a 256 bit ECC with more complex processing can recover significantly more bits than a 78 bit ECC.

The ECC decoder receives the data and determines if any data failures have occurred. Because the ECC decoder takes extra time to resolve errors, the timing on the input is done using the decoder, not the DMA. When the decoder has resolved the data is good, it gives an OK status and the next DMA cycle begins.

If a data failure has occurred, the decoder produces an error status and a count of the errors. This alerts the MPU which reads the error data from the decoder. The repair operations are then controlled by the MPU. Using the ECC data, the decoder calculates replacement bits for locations that fail the ECC analysis for that sector. Bits may fail to be correctly retrieved in the flash memory for a number of reasons including: noise during the writing process that incorrectly stores the bit value in memory, failure of a bit location in the flash memory, or noise in the reading process. It is not likely that more than a few bits in a sector will fail due to noise. These failed bits can be corrected by the ECC decoder and MPU. For example, a 78 bit ECC algorithm can be used to correct up to 7 bit errors. If the ECC decoder detects a failure of a bit location in the flash memory, the page management techniques described above can be used to remove the defective page from use.

Figure 17:
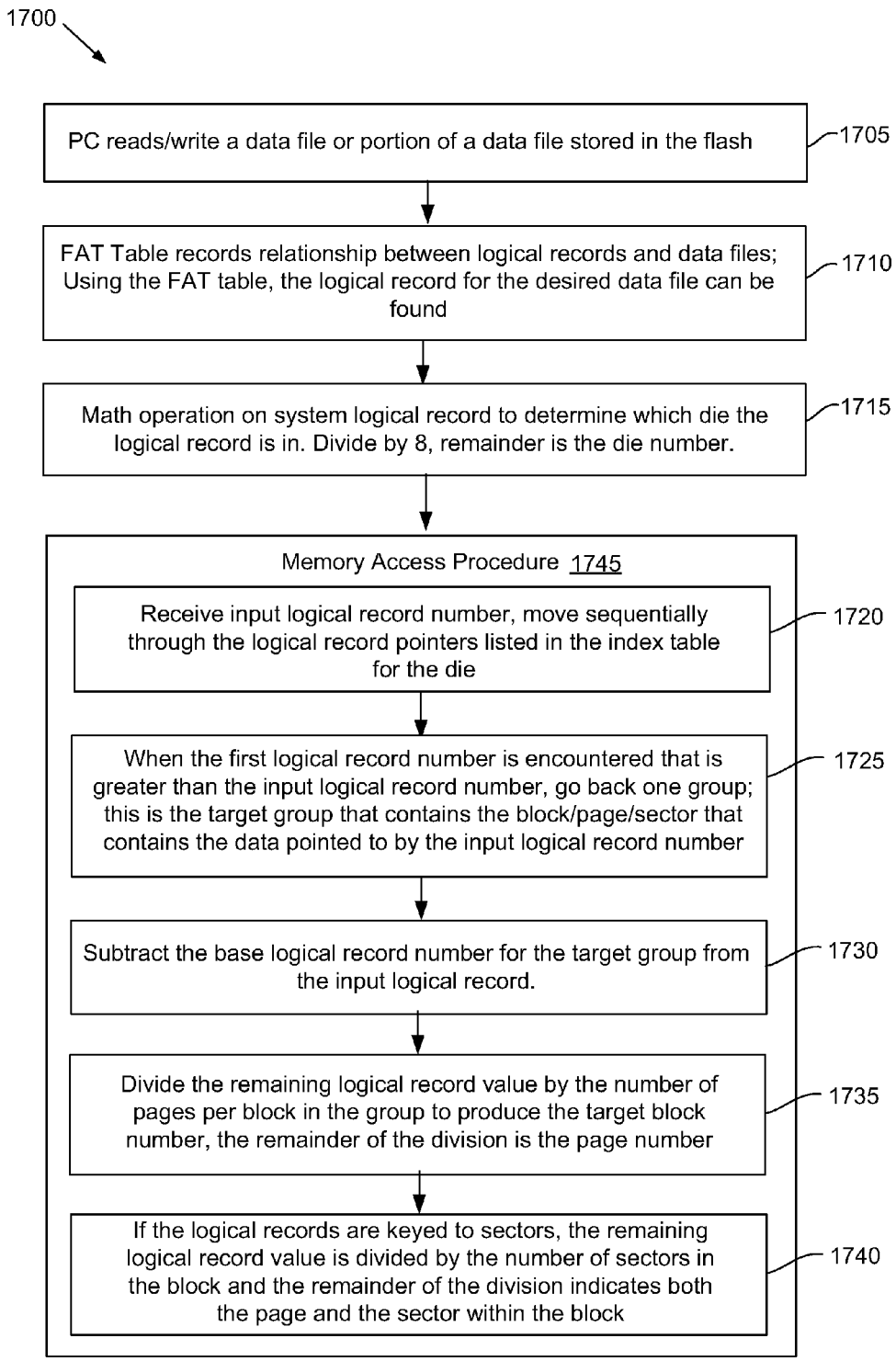
FIG. 17 is a flowchart of a memory access procedure, according to one example of principles described herein.

To access a particular page or pages within the flash memory, a memory access procedure (1700) shown in FIG. 17 can be used. The host computing device reads/writes a data file or portion of a data file stored in the flash (step 1705). The file access table (FAT) records the relationship between the logical records and the data files. Using the FAT table, the logical record for the desired data file can be found (step 1710). A method operation si performed on the system logical record to determine which die the logical record is in (step 1715). For example, the system logical record number may be divided by 8 (when there are 8 die) and the remainder is the die number of the die that contains the logical record number.

After the correct die is identified, the memory access procedure (1745) includes receiving an input logical record number and moving sequentially through the logical record pointers listed in the index table for the selected die (step 1720). When the first logical record number is encountered that is greater than the input logical record number, the process goes back one group to the target group that includes the block/page/sector that is pointed to by the input logical record number (step 1725). The base logical record number of the target group is subtracted from the input logical record number (step 1730). The remaining logical record value is divided by the number of pages per block in the group (if the logical records are keyed to pages) to produce the target block number, with the remainder of the division producing the page number (step 1735). If the logical records are keyed to sectors, the remaining logical record value is divided by the number of sectors in the block and the remainder of the division indicates both the page and sector within the block.

The numerical example below assumes that the logical record pointers are keyed to each sector and that there are 16 sectors in a page. If a logical record number of 32672002 is received, the controller accesses the index table (FIG. 3) and compares the logical record pointers listed for each group to the input logical record number of 32672002. In the example of the index table shown in FIG. 3, the controller compares the input logical record number to the first logical record pointer, which has a value of 0, and determines that 32672002 is greater than 0. The controller continues by comparing the input logical record number to the second logical record pointer (17317888) for group 254 and determines that the input logical record is greater than this logical record pointer. Similarly, the controller determines that the input logical record number is greater than the third logical record pointer (30911968). However, when the controller compares the input logical record number to the logical record pointer for group 250, the controller determines that its logical record pointer 32960224 is greater than the input logical record number 32672002. This identifies the third group (group 252) as containing the page that corresponds to the input logical record number. The controller then subtracts the base logical record number (the logical record pointer) for group 252 from the input logical record number: 31672002−30911968=1760034. This remaining logical record number is divided by the number of pages per block in group 252: 1760034/(252)=6984.262. The whole number (6984) is the index to the block number within the group. This index is added to the base index (beginning address) for the group to produce the correct block address for the target block. The remainder of the division (0.262) can be used to calculate the page/sector address.

FIG. 18 is a diagram of a translation table. A translation table created is created by reading every block in the memory in the start up program. The start up program produces a listing with two entries for each block in logical record order. First an index table is generated for each die. For 8 gigabyte die, the index table may have a size of approximately 8 kilobytes. A post operation spreads the logical records across multiple die and builds the translation table that is ordered by logical record number. The translation table enables translation from a logical record number to specific die and block.

For a single die, the translation table includes a list of only die and block numbers (in logical record order) for only die 1. For two die devices, the translation table includes die and block numbers for both die. Similarly for a four die device, all eight entries for all four die are used in the translation table.

The translation table is stored in memory locations 3000 and 4000 (described below with respect to FIG. 19) which, in this example, has a total capacity of 8 kilobytes. For flash devices with multiple die, this may not be enough room to store the entire translation table. To solve this issue, the portion of the translation table which contains the index to the FAT table is stored in memory location 3000 (section 3 in FIG. 19) while address space 4000 (section 4 in FIG. 19) store other portions of the translation table of memory locations that are actively being used. This allows the initial memory locations including the FAT table memory locations to be efficiently accessed while translation table overlays can be swapped into and out of 4000 section of address space. When the next requested logical record number is out of the portion translation table stored in the 3000 and 4000 memory range, another overlay is loaded into 4000 that contains the desired logical record number. Prior to swapping out the current overlay in 4000, a check is performed to determine if the current overlay has changed. If it has, the current overlay is written to a new page as an updated file.

In sum, the principles described above provide for flash memory devices that are configured to provide data transfer speeds of approximately 30 megabytes per second to and from the flash die. To overcome the long write times that are inherent in flash memory, the flash controller has eight memory buffers that allow multiple flash die to be written at the same time. In this implementation, each memory buffer has two banks that can be combined to allow for storage of 8 kilobytes of data in one write cycle.

It takes more than 1 millisecond from the time a die is given a write page instruction to write a page to both planes. By writing the first die as soon as it has received a page of data from the data bus, the incoming data can then being stored into the next available memory buffer. As soon as one memory buffer is full, another memory buffer is assigned to the USB DMA so that the data streaming in on the USB bus always has a memory buffer to write to. The USB interface protocol designates the transfer is complete by sending an interrupt to the MPU. After receipt of the interrupt, the MPU enables the USB interface to send the next data or command. When the requested sectors have been transmitted to the buffers, the interrupt routine determines if the each of the sectors contain a command or data. If the sector contains data, the sector is counted in the total amount of data in the transfer. If the sector is a command, it is transferred to the MPU for execution. After the command has been executed, an interrupt routine sends a status response to the host computing device that the command has been executed. The MPU then operates in a waiting loop until the next command is received. In general, every flash operation (read or write) is status checked in this manner.

As discussed above, the USB interface under direction of the MPU sequentially writes data into the memory buffers. After enough memory buffers are full, the flash DMA, under control of the MPU begins transferring the data out of the memory buffer to the flash buffer. Before reusing a memory buffer, the MPU polls for errors in writing the data to the flash by polling the flash die for status commands. If the status commands indicate that the data was written and there where no errors, the MPU understands that the writing to flash memory was accomplished without errors, the MPU releases the memory buffer(s) to be refilled with data from the USB bus. By the time that the USB DMA has filled the last memory buffer with data, the flash DMA has emptied the first memory buffers. Thus, if there are memory buffers available, the USB DMA can continuously transfer data from the USB bus. If there are no memory buffers available, the MPU does not enable the next read from the USB bus.

The USB interface and USB DMA store incoming data in the memory buffers in a way that directly corresponds to pages in the flash die. The memory buffers are filled sequentially and paired together if the page size is greater than the buffer size. For example, if the page size is 8k and the buffers have a size of only 4k, two buffers can be paired. In other implementations, the buffers can have a size of 8k and each store one page of data.

For example, it may take the USB DMA/USB interface approximately 137 microseconds to load a 4 kilobyte buffer with USB data. In this example, one page of data is 8 kilobytes. Thus it takes the USB DMA/USB interface 270 microseconds total to write two 4 k buffers to form the 8 k page and about 1.2 milliseconds for the flash DMA to write that page to the die. The next pair of buffers can be loaded by the USB DMA/USB interface in another 270 microseconds and the next 1.2 millisecond flash DMA transfer to the next die can be started while the first write to the die is still in process. When writing the data to the flash die, four flash die are written in parallel. As discussed below, logical records are written sequentially across all flash die in the memory device. Because most reads and writes are to sequential series of logical records, these reads and writes are distributed across the flash and can be performed in parallel. This process continues with the third pair of buffers being loaded in 270 microseconds and the fourth pair of buffers being loaded in 270 milliseconds. By the time that the USB interface completes writing to the fourth pair of buffers, the first pair of buffers is empty and available to accept data from the USB DMA/USB interface. Every pair of memory buffers will be ready to receive the next set of data from the USB DMA/USB interface at the appropriate time so that the USB bus can run at its full rate.

Figure 19:
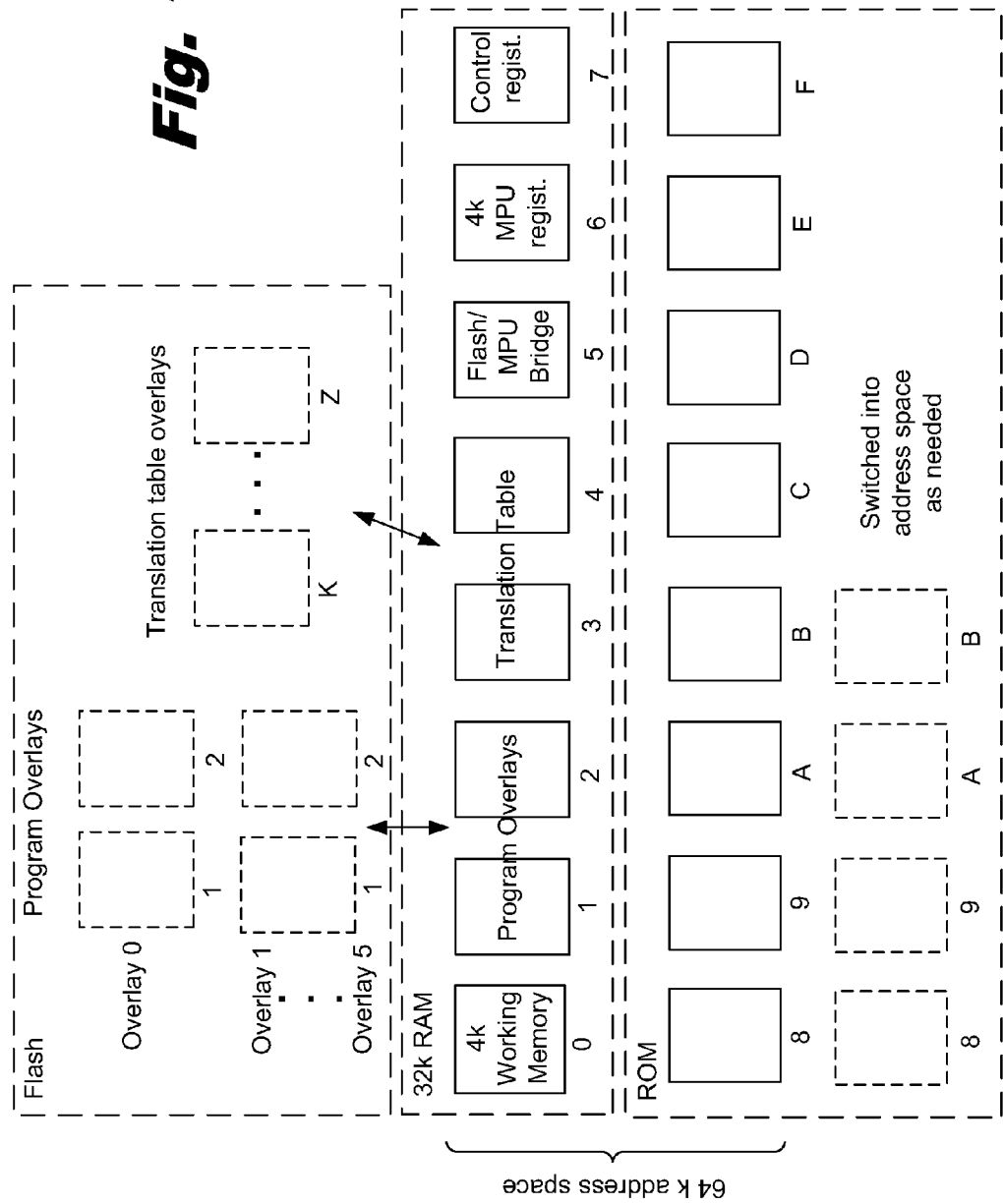
FIG. 19 is a diagram showing the use of data and program overlays, according to one example of principles described herein.

FIG. 19 is a diagram of data and program overlays that can be used in the system. The term "overlaying" refers to replacement of a block of stored instructions or data with a different block of instructions or data. Overlaying is a programming method that allows programs or data sets to be larger than the computer's main memory. The embedded USB system has a limited amount of physical memory/address space. The programs and data that the MPU may need to access may exceed the available physical memory/address space. Constructing an overlay program involves dividing a program into self-contained segments called overlays. In this example, a portion of the overlays are stored in protected areas of the flash memory that is not accessible for normal data operations. An overlay manager executed by the MPU loads the required overlay from the flash memory into the appropriate physical memory/address space when it is needed.

The use of overlays allows all common operations ("subroutines") to be stored when needed in the 48 kilobytes of ROM on memory controller chip. The control of these subroutines is done in the overlays so that any errors in the ROM code can be fixed by calling the same corrected subroutine from the flash memory. In addition to using overlays for control and to add more code space, the overlays allow the same controller flexibility to deal with both multilevel cell (MLC) memory and triple level cell (TLC) memory dies. To switch the operation of the controller between MLC and TLC memory, the appropriate routines can be changed in flash and then accessed by the controller through overlays. In the original test program, the overlays are written on the flash. For MLC memory devices, one set of overlays is written and for TLC memory a different set of overlays is written into the same space.

As discussed above, the MPU is connected to read only memory (ROM) and random access memory (RAM). The combination of the RAM and ROM creates an address space. In this example, the address space has a size of 64 kilobytes which can be addressed using a six bit address. In FIG. 19 this address space is shown as being divided into 16 different 4 kilobyte sections, with each section labeled with a hexadecimal identifier (0 ... F). Section 0 is a 4 kilobyte of working memory for the MPU. Sections 1 and 2 are used to store the overlay that the MPU is executing. As discussed above, these two sections may be insufficient to store all the programming desired. To augment the program(s), a number of program overlays (Overlay 0 ... Overlay 5) are stored in flash. These overlays may be substituted into the program overlay memory in RAM as needed to execute the desired program.

Sections 3 and 4 in the RAM are designated for storing the translation table. In this example, a number of translation table overlays (K ... Z) are stored in flash. These translation tables can be substituted into the sections 3 and 4 of the RAM as needed. The RAM is directly and quickly accessible by the MPU, which can access the translation tables as needed. Section 5 of the RAM address space is a Flash/MPU bridge. Section 6 ('6000 addresses') is a 4 kilobyte section that may contain selected MPU registers. The 6000 addresses are accessible by the MPU as if it was part of the memory space of the MPU. Section 7 ('7000 addresses') contains the control registers (see e.g., FIG. 5 and Tables 1-8).

Sections 8-F are locations within the ROM memory. The size of the ROM is greater than the 32 kilobytes of address space allotted to the ROM. A number of additional sections can be switched into the address space as needed. In the example shown in FIG. 19 there are four additional sections (8, 9, A, B) that can be substituted into the ROM address space as needed.

The description above is only one example. A variety of other implementations could be used according to the principles described. For example, the address space, RAM, and ROM may have different sizes and the number or type of overlays could be different.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A Universal Serial Bus (USB) flash memory device comprising:
    a plurality of flash die; and
    a memory controller, the memory controller comprising:
        a microprocessor;
        a plurality of memory buffers;
        a USB interface to directly deposit data from an external bus into the plurality of memory buffers;
        a flash Direct Memory Access (DMA) module to access data in the plurality of memory buffers and transfer the data from a first memory buffer to a flash die while the USB interface is depositing data from the external bus in a second memory buffer.

2. The device of claim 1, further comprising a control register in which the microprocessor writes upper bits of an address to the control register and the USB interface writes lower bits of an address to the control register.

3. The device of claim 1, in which the DMA module is a dual DMA module that transfers data and commands based on sequential use of two registers in the DMA, each register controlling access to a different data source.

4. The device of claim 1, a plurality of buffer switches for selectively connecting a corresponding memory buffers to the external bus through the USB interface and to an internal bus connected to the plurality of flash die.

5. The device of claim 4, wherein the buffer switches comprise a null state when the switch is switched between buses and not connecting to either bus.

6. The device of claim 1, further comprising an error correction code (ECC) module, wherein the DMA transfers data from a memory buffer, internal control data from the microprocessor and error correction data from the ECC to a flash buffer of one of the flash die without receiving intermediate instructions from the microprocessor.

7. The device of claim 1, further comprising a page-based failure management system for the flash die.

8. The device of claim 7, wherein the page-based failure management system comprises memory of the microprocessor storing an indication of operability for pages in the flash die, such that the device uses a page indicated to be operable within a block of pages, where that block also includes another page indicated to be inoperable.

9. The device of claim 8, further comprising a table stored in the memory of the microprocessor listing operable and inoperable pages in the flash die.

10. The device of claim 9, in which memory blocks of the flash die are assigned to groups, each memory block in a particular group having a same number of pages indicated as operable.

11. The device of claim 1, wherein the flash die are indexed using logical record numbers that are sequentially striped across all the flash die.

12. The device of claim 11, wherein the sequential stripping of the logical record numbers enables write and read operations to multiple die in sequence.

13. The device of claim 1, further comprising a Random Access Memory (RAM) device in communication with the microprocessor, wherein program overlays stored in non-volatile memory are swapped into the RAM device to provide additional functionality to the microprocessor.

14. The device of claim 13, wherein a first combination program overlay is configured to be implemented by the microprocessor to manage multilevel cell (MLC) flash memory and a second program overlay is configured to be implemented by the microprocessor to manage triple level cell (TLC) flash memory.

15. The device of claim 13, wherein a first program overlay received from an external source is configured to be implemented by the microprocessor to do initial testing of the flash memory and a second program overlay is configured to be implemented by the microprocessor during operation as a memory controller.

16. The device of claim 13, further comprising translation table overlays configured to be swapped into the RAM device to provide indexing to multiple flash die.

17. The device of claim 16, wherein the translation table overlays are configured to create a logical volume striped over multiple die and block groups, wherein the die have different memory capacities.

18. The device of claim 13, wherein the RAM device is configured to swap out program overlays to accomplish particular steps in a process.

19. A method for high speed data transfer to a flash memory by a Universal Serial Bus (USB) controller that comprises a microprocessor, the method comprising depositing incoming data from a USB interface, that is connected to an external data bus, directly into a memory buffer directly accessible to both the microprocessor and a flash Direct Memory Access (DMA) module.

20. The method of claim 19, further comprising:
directly depositing data from the external bus sequentially into a plurality of memory buffers; and
with the flash DMA, simultaneously transferring data from one of the plurality of memory buffers to flash memory, the flash memory comprising a plurality of flash die.

21. The method of claim 20, wherein transferring data from a memory buffer to flash memory by the DMA is performed without intervention by the microprocessor.

22. The method of claim 20, further comprising transferring a data segment from one of the memory buffers to both an Error Correction Code (ECC) module and the flash memory.

23. The method of claim 22, further comprising simultaneously transferring control data from one of the memory buffer to a flash bus connected to the flash memory and to the ECC module.

24. The method of claim 23, further comprising transferring error correction code from the ECC to the flash bus.

25. The method of claim 19, in which depositing incoming data directly into a memory buffer comprises:
generating, with the USB interface, a first portion of a target address in the memory buffer; and
generating, with the DMA, a second portion of the target address.

26. The method of claim 25, in which lower bits of the target address are generated by the USB interface and the higher bits of the target address are generated by the DMA.

27. A method for high speed data transfer to a flash memory by a Universal Serial Bus (USB) controller that comprises a microprocessor, the method comprising depositing incoming data from a USB interface, that is connected to an external data bus, directly into a memory buffer directly accessible to both the microprocessor and a flash Direct Memory Access (DMA) module;
in which the memory buffer comprises a plurality of individual memory buffers, in which each memory buffer is paired to a switch, each switch being individually controlled to selectively connect individual memory buffers to a USB bus of the USB interface or a flash bus connected to flash memory, the method further comprising:
using a first switch to connect a first memory buffer to the USB bus;
using a second switch to connect a second memory buffer to the flash bus; and
simultaneously transferring incoming data from the USB bus to the first memory buffer and transferring data from the second memory buffer to the flash bus.

28. The method of claim 27, further comprising:
receiving, by first two flash buffers associated with a first flash die, data from the flash bus until the first two flash buffers are full;
receiving, by second two flash buffers associated with second flash die, data from the flash bus until the second two flash buffers are full; and
simultaneously writing data from the first two flash buffers to flash memory on the first flash die and writing data from the second two flash buffers to flash memory on the second flash die.

29. The method of claim 28, further comprising simultaneously:
transferring incoming data from the first USB bus to the first memory buffer;
transferring data from the second memory buffer to the flash bus;
receiving, by the first flash buffer associated with the first flash die, data from the flash bus; and
writing data from the second flash buffer to flash memory on the second flash die.

30. The method of claim 19, further comprising managing failure in the flash memory using a page-based failure management system.

* * * * *